US005642252A

United States Patent [19]
Sakamoto et al.

[11] Patent Number: 5,642,252
[45] Date of Patent: Jun. 24, 1997

[54] INSULATED GATE SEMICONDUCTOR DEVICE AND DRIVING CIRCUIT DEVICE AND ELECTRONIC SYSTEM BOTH USING THE SAME

[75] Inventors: Kozo Sakamoto, Hachiouji; Isao Yoshida, Hinode-machi; Shigeo Otaka, Takasaki; Tetsuo Iijima, Maebashi; Harutora Shono, Gunma-machi; Ken Uchid, Higashiyamato; Masayoshi Kobayashi, Takasaki; Hideki Tsunoda, Akishima, all of Japan

[73] Assignees: Hitachi, Ltd.; Hitachi ULSI Engineering Corp., both of Tokyo, Japan

[21] Appl. No.: 288,729

[22] Filed: Aug. 15, 1994

[30] Foreign Application Priority Data

Aug. 18, 1993 [JP] Japan ................... 5-204364

[51] Int. Cl.$^6$ ........................... H02H 3/00
[52] U.S. Cl. ............... 361/93; 361/18; 361/91; 361/103; 361/115
[58] Field of Search ................. 361/18, 56, 91, 361/103, 93, 115

[56] References Cited

U.S. PATENT DOCUMENTS

| | | | |
|---|---|---|---|
| 3,748,547 | 7/1973 | Sugimoto | 361/56 |
| 4,896,199 | 1/1990 | Tsuzuki | 357/28 |
| 5,025,298 | 6/1991 | Fay et al. | 357/41 |
| 5,128,823 | 7/1992 | Fujimoto et al. | 361/93 |
| 5,303,110 | 4/1994 | McMagai | 361/18 |
| 5,304,802 | 4/1994 | Kumagai | 257/328 |

FOREIGN PATENT DOCUMENTS

| | | | |
|---|---|---|---|
| 62-143450 | 6/1987 | Japan | H01L 27/04 |
| 63-229758 | 9/1988 | Japan | H02H 9/02 |
| 63-229757 | 9/1988 | Japan | H02H 9/02 |
| 5-21787 | 1/1993 | Japan | H01L 29/784 |
| 5-304450 | 11/1993 | Japan | H03K 17/08 |

*Primary Examiner*—Jeffrey A. Gaffin
*Assistant Examiner*—Stephen Jackson
*Attorney, Agent, or Firm*—Fay, Sharpe, Beall, Fagan, Minnich & McKee

[57] ABSTRACT

An improvement in conditions that protective functions of an insulated gate semiconductor device with a protection circuit incorporated therein are performed, an improvement in the cutoff of heating, the prevention of malfunctions and an improvement in ease of usage can be achieved.

The insulated gate semiconductor device of the present invention comprises a power insulated gate semiconductor element (M9), at least one MOSFET (M1 through M7) for a protection circuit, for controlling the power insulated gate semiconductor element, a constant-voltage circuit using forward voltages developed across diodes (D2a through D2f) for the constant-voltage circuit, and voltage restricting diodes (D1 and D0a through D0d) for controlling the upper limit of a power supply voltage of the constant-voltage circuit. Power to be supplied to the voltage restricting diodes is supplied from an external gate terminal of the power insulated gate semiconductor element.

The present invention can bring about an advantageous effect that an improvement in reliability of the insulated gate semiconductor device and an improvement in the ease of use can be achieved.

23 Claims, 23 Drawing Sheets

SOLID LINE : HYSTERESIS OPERATION (WHEN INCREASE IN TEMPERATURE IS SLOW)
BROKEN LINE : LATCH OPERATION (WHEN INCREASE IN TEMPERATURE IS FAST)

INSULATED GATE SEMICONDUCTOR DEVICE AND DRIVING CIRCUIT DEVICE AND ELECTRONIC SYSTEM BOTH USING THE SAME

BACKGROUND OF THE INVENTION

The present invention relates to an insulated gate semiconductor device (insulated gate transistor) such as a power MOSFET (Metal Oxide Semiconductor Field Effect Transistor), an IGBT (Insulated Gate Bipolar Transistor) or the like, and particularly to a power insulated gate semiconductor device capable of improving reliability of an insulated gate semiconductor device whose protective functions are provided on a chip.

An insulated gate field effect transistor referred to as a "power MOSFET" and capable of handling large power, which has an overheating cutoff circuit internally provided on the same chip to improve the reliability of the insulated gate field effect transistor, has been disclosed in Japanese Patent Laid-Open Publication No. 63 (1988) -229758 as an illustrative example. In the conventional example, a resistance and a zener diode are series-connected between an external gate terminal and an external source terminal. A constant voltage is generated across the zener diode. A resistance is electrically connected to one of both ends of the zener diode, which is located on the external source terminal side, and a diode is electrically connected to the other thereof which is located on the external gate terminal side. In this condition, the temperature is detected by detecting a variation in a fixed or variable fraction of the applied voltage, which is obtained by the resistance and the diode. When devices or elements are overheated, a MOSFET for a protective circuit, whose gate and source are respectively connected to both ends of the resistance, is turned on to cut off or interrupt the power MOSFET that is a main body. In the conventional overheating cutoff circuit, a variation in the gate-to-source voltage of the n-channel MOSFET for the protection circuit becomes large with respect to a variation in the external gate voltage. Therefore, the variation in the gate voltage is liable to relate to a variation in the overheating cutoff temperature.

Japanese Patent Laid-Open Publication No. 63(1988)-229758, Japanese Patent Laid-Open Publication No. 5(1993)-21787, Japanese Patent Laid-Open Publication No. 62(1987)-143450, Japanese Patent Laid-Open Publication No. 5(1993)-304450, Japanese Patent Laid-Open Publication No. 63(1988)-229757, U.S. Pat. Nos. 5,025,298 5,128,823 disclose insulated gate transistors.

SUMMARY OF THE INVENTION

In the prior art, only the zener diode has been employed in the constant-voltage circuit to reduce the variation in the cutoff temperature with respect to the variation in the gate voltage. However, an investigation of the present inventors has revealed the following problems:

(Problem 1): When the withstand voltage of the zener diode reaches about 7 V or less, the zener diode will softly break down. Thus, when the external gate voltage is 5 V or so, the cutoff temperature is susceptible to a variation in the external gate voltage. Accordingly, a voltage range permissible to the external gate terminal leads to a narrow voltage range of 4 V to about 7 V or less, taking into consideration variations in the elements.

(Problem 2): When the gate voltage becomes negative, a leakage current flows from an external drain terminal to the external gate terminal under the operation of a parasitic bipolar transistor. It is therefore not possible to employ the zener diode in a source follower circuit.

(Problem 3): When a drain voltage becomes negative, a current flows from the drain of the MOSFET for the protection circuit to the external source terminal under the operation of the parasitic bipolar transistor.

(Problem 4): When a drain current abruptly flows upon occurrence of a short circuit in a load, a source pad is subjected to the maximum temperature. It is therefore necessary to determine the position of each temperature detecting device or element depending on the position of the source pad.

The present invention was made based on the results of investigation referred to above. It is therefore an object of the present invention to provide an insulated gate semiconductor device having protective circuit functions, which is capable of providing high reliability and ease of use.

In order to achieve the above object, an insulated gate semiconductor device according to one aspect of this invention comprises:

(Means 1) A power insulated gate semiconductor element (M9);

at least one MOSFET (M1 through M7) for a protection circuit, for controlling a current flowing in the gate of the power insulated gate semiconductor element;

a constant-voltage circuit using forward voltages developed across first diodes (D2a through D2f); and voltage restricting means (D1 and D0a through D0d) for restricting an upper limit of a power supply voltage of the constant-voltage circuit, whereby power to be supplied to the voltage restricting means is supplied from an external gate terminal of the power insulated gate semiconductor element (FIG. 1).

(Means 2) An insulated gate semiconductor device comprises:

a power insulated gate semiconductor element (M9);

at least one MOSFET (M1 through M7) for a protection circuit, for controlling the power insulated gate semiconductor element;

third diodes (D5 through D7) connected to a drain-to-body diode of the MOSFET for the protection circuit along a reverse direction; and fourth diodes (D0a through D0d) connected between an external gate terminal of the power insulated gate semiconductor element and an external source terminal (external emitter terminal) thereof, whereby a current flows in the fourth diodes in such a manner that the third diodes do not break down even if an external gate terminal voltage varies, thereby clamping a voltage applied to each of the external gate and source terminals (FIG. 1).

(Means 3) The insulated gate semiconductor device is provided with means for reducing a gate-to-source voltage of the first MOSFET (M1) for the protection circuit when an external drain voltage becomes negative (FIG. 1).

(Means 4) An insulated gate semiconductor device comprising a power insulated gate semiconductor element, a temperature detecting circuit, and a gate cutoff circuit for restricting a current flowing in the power insulated gate semiconductor element when the temperature of the insulated gate semiconductor device reaches a predetermined temperature, is characterized in that at least one temperature detecting device or element used for the temperature detecting circuit is formed (within a region surrounded by P1 through P7) between a region for a protection circuit other than the temperature detecting element and a region for a pad which is used for an external source terminal of the power insulated gate semiconductor element (FIG. 2). If a further limitation is taken, the temperature detecting element is disposed so as to fall within 300 μm from the pad for the external source terminal of the power insulated gate semiconductor element (FIG. 2).

According to typical embodiments of this invention, the following functions can be brought about:

(Function 1)

When a constant voltage of about 3 V is generated based on the forward voltages developed across the first diodes (D2a through D2f) and the external gate voltage reaches about 10 V or higher, the dependence of the constant-voltage circuit on the gate voltage can be controlled by the reverse-connected diodes (D1 and D0a through D0d) (FIG. 1).

(Function 2)

When withstand voltages of D5 through D7 and D0a through D0d and a forward voltage drop meet the following expression, the drain-to-body diode of each MOSFET (M1 through M7) for the protection circuit can be prevented from being biased in the forward direction, so that the current can be prevented from flowing from the drain of the power MOSFET to the gate thereof under the operation of a parasitic bipolar transistor.

$$BV(D5), BV(D6), BV(D7) > Vf(D0a) + BV(D0b) + Vf(D0c) + Vf(D0d) \quad (1)$$

(Function 3)

When the drain voltage of the power MOSFET becomes negative in a state in which the cutoff circuit has been operated, the parasitic bipolar transistor is operated. In the worst case, latched information is erased. Thereafter, when a chip is not cooled even after the drain voltage of the power MOSFET has become negative, it is necessary to activate the cutoff circuit. However, when the drain voltage of the power MOSFET becomes negative with an additional M5, a drain voltage of the M5 is brought to zero volts so that the M1 is easy to be turned off. Therefore, the cutoff circuit is prone to operate (FIG. 1).

(Function 4)

In the case of a normal power MOSFET, only one metallic electrode layer is formed on the surface of a semiconductor. It is necessary to form a source electrode layer for the power MOSFET and circuitry wiring for the temperature detecting element or the like with the one metallic electrode layer. By forming the temperature detecting element within the region defined between the region for the protection circuit other than the temperature detecting element and the region for the pad which is used for the external source terminal of the power insulated gate semiconductor element, the temperature detecting element can be brought close to the source pad at which the temperature most easily rises within a semiconductor chip when a short circuit in a load takes place. At the same time, the source electrode layer for the power MOSFET becomes hard to be cut, thereby making it possible to prevent the resistance of the source electrode layer from increasing.

BRIEF DESCRIPTION OF THE DRAWINGS

The above and other objects, features and advantages of the present invention will be more apparent from the following description, referring to the accompanying drawings in which.

DETAILED DESCRIPTION OF THE PREFERRED EMBODIMENTS

Preferred embodiments of the present invention will hereinafter be described in more detail with reference to the accompanying drawings.

Figure 1:
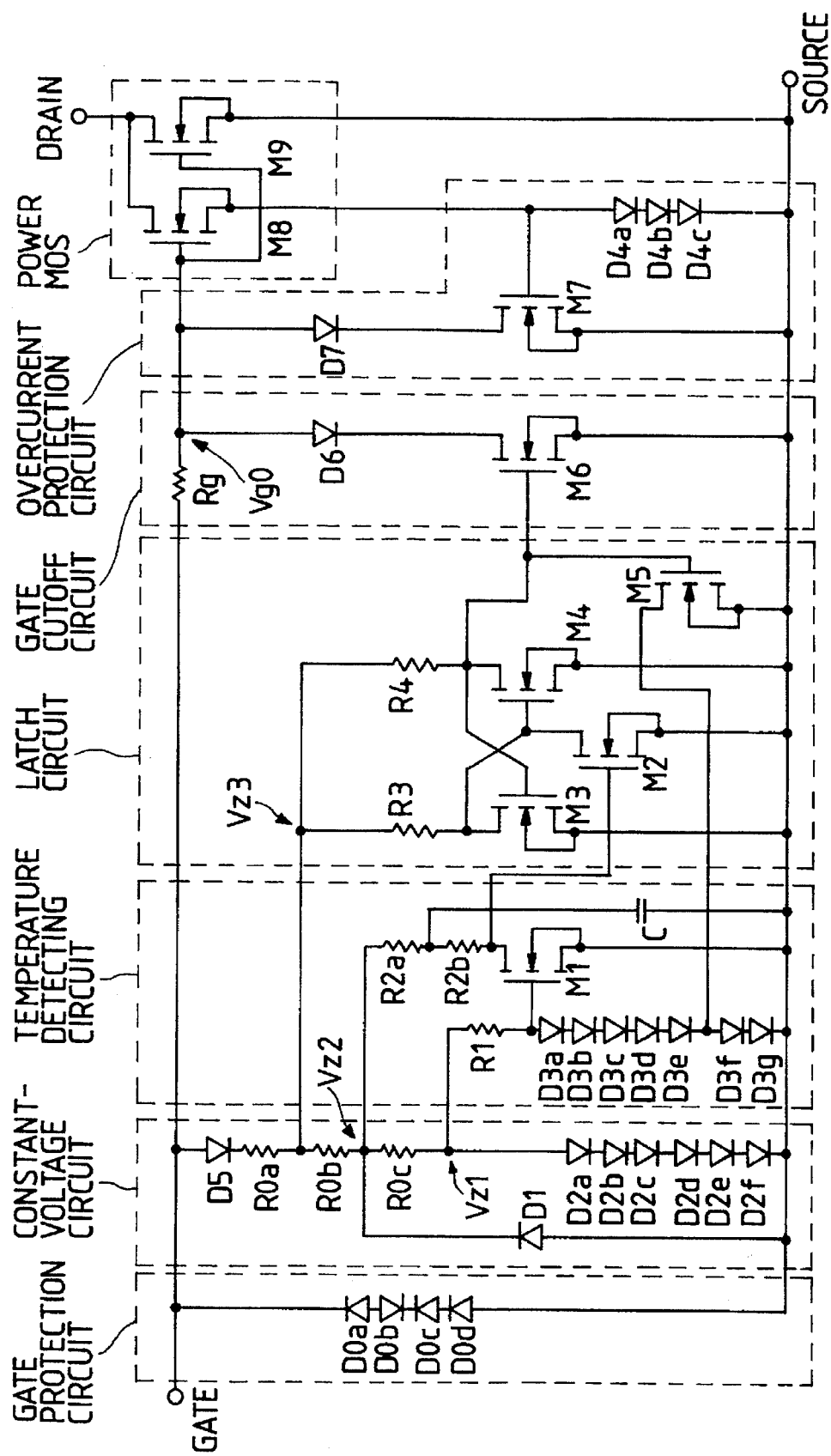
FIG. 1 is a circuit diagram showing a semiconductor device according to a first embodiment of the present invention.

FIG. 1 is a circuit diagram of a semiconductor device according to a first embodiment of the present invention. The semiconductor device is fabricated on a single semiconductor substrate. The semiconductor device according to the present invention has an overheating and overcurrent protective or protection circuit internally provided on a chip identical to that for a power MOSFET (M9) section in order to prevent respective elements or devices from being destroyed due to overheating of the power MOSFET section or an overcurrent or excessive current that flows therein.

The semiconductor device according to the present embodiment comprises a gate protection circuit, a constant-voltage circuit, a temperature detecting circuit, a latch circuit, a gate cutoff circuit, an overcurrent protection circuit and a power MOSFET.

Figure 24:
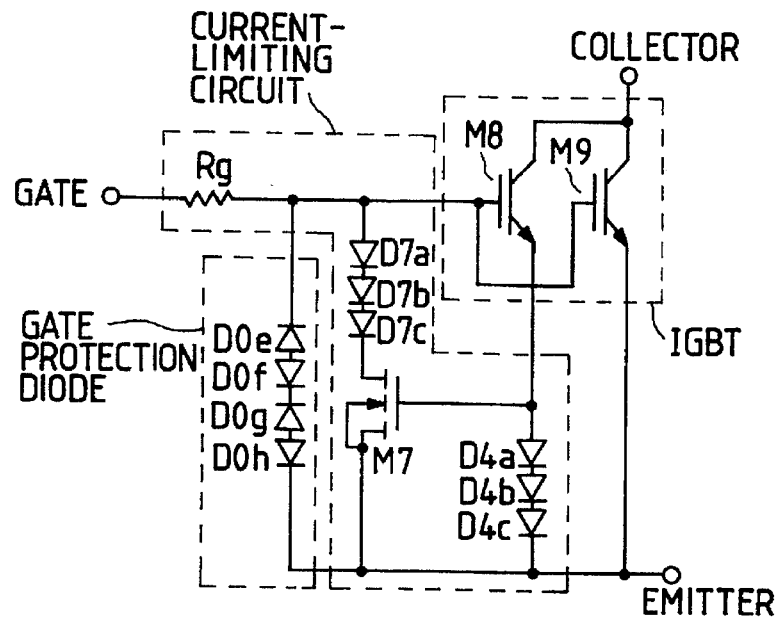
FIG. 24 is a circuit diagram illustrating a semiconductor device according to a fifteenth embodiment of the present invention.

A power MOSFET will be used to illustrate where the present invention may be integrated as shown in FIG. 1; however, the invention is not limited to this specific device. The present invention can be used in other semiconductor devices, such as bipolar transistors, insulated gate bipolar transistors as shown in FIG. 24, and the like. The power MOSFET M9 has a gate (control terminal) coupled to an external gate GATE (first terminal), a drain coupled to an external drain DRAIN (second terminal), a source coupled to an external source SOURCE (third terminal) and a drain-source path (current path) coupled between the external drain DRAIN and the external source SOURCE. In insulated gate bipolar transistors the source would correspond to an emitter, the drain to a collector and the drain-source path to a collector-emitter path.

The MOSFET M6 (switch circuit) has a drain-source path (current path) coupled between the cathode of the diode D6 and the external source SOURCE and a gate (control terminal) couled to the gate of MOSFBT M3. The MOSFET M7 (switch circuit) has a drain-source path (current path) coupled between the cathode of the diode D7 and the external source SOURCE and a gate (control terminal) coupled to the drain-source path of the power MOSFET M8.

The temperature detecting circuit makes use of polycrystalline sillicon diodes D3a through D3g which serve as a temperature detecting or sensing element or device. A forward voltage Vf developed across each polycrystalline sillicon diode employed in the present embodiment exhibits a temperature coefficient or characteristic of about −1.5 mV/° C. per polycrystalline silicon diode. Thus, when the temperature of the chip increases, a voltage at a point where a polycrystalline silicon resistance R1 is connected to the polycrystalline silicon diodes D3a through D3g, is reduced. When this voltage is reduced to a threshold voltage or lower, A MOSFET M1 is turned off so that the gate cutoff circuit is operated.

A resistor or resistance R4 in the latch circuit is set so as to be larger than a resistance R3 by about one figure. Therefore, when a positive voltage is applied to a gate terminal in the case where the semiconductor chip does not reach a high temperature, the output of the latch circuit is brought to a low potential so that the gate cutoff circuit is inactivated.

When an increase in temperature is detected by the temperature detecting circuit and the output of the latch circuit changes from the low potential to a high potential, M6 in the gate cutoff circuit is turned on so that the power MOSFET M9 is turned off. Once the overheating cutoff circuit is operated, the output of the latch circuit is brought to a high potential so that a cutoff state is maintained. Therefore, the voltage applied to the gate of M9 is maintained at a low potential even if the temperature of the chip is reduced. In order to turn on the power MOSFET M9 again, it is necessary to first reduce the voltage applied to an external gate terminal thereof to a level in the vicinity of zero volts and then reset the latch circuit.

The overcurrent protection circuit monitors a current supplied to the drain of M9, using a current supplied to the drain of a sensing MOSFET M8 having a gate width (e.g., 900 μm) which is less than or equal to about one-thousandth of a gate width of the main MOSFET M9. When the excessive current flows in M9, M7 is turned on so as to lower the gate voltage of M9, thereby restricting the drain current of M9.

A first feature of the present embodiment is that a constant-voltage circuit is provided which makes use of forward voltages developed across polycrystalline silicon diodes D2a through D2f as well as those developed across protecting polycrystalline silicon diodes D0a, D0c, D0d for restricting the positive voltage at the gate terminal to 20 V or less, and the temperature detecting circuit is operated using this voltage Vz1. A further feature of the present embodiment is that since the dependence of the temperature detecting circuit on the gate voltage is further lowered, a voltage Vz2 is restricted to about 8 V or lower by a polycrystalline silicon diode D1. Incidentally, the present embodiment can bring about an advantageous effect that since the diodes D2a through D2f for the constant-voltage circuit and the temperature detecting diodes D3a through D3g are arranged in the same direction, the two groups serve so as to offset element variations in the diodes.

If a withstand voltage is less than or equal to about 6 V, then a breakdown characteristic of each diode exhibits soft breakdown. It is therefore not possible to obtain a satisfactory constant-voltage circuit. In the present embodiment, a variation in Vz1 with respect to a variation in the gate terminal voltage can be restrained or controlled using the forward voltages developed across the polycrystalline silicon diodes so as to hold the gate terminal voltage at a constant voltage of about 3 V or less. Therefore, an advantageous effect can be brought about that the lower value of the gate terminal voltage at which the overheating cutoff circuit is normally operated, can be changed from a conventionally-used voltage of about 4 V to about 3 V. Further, the constant-voltage circuit can lower not only the dependence of Vz1 on the gate terminal voltage but also the dependence of the output power supply voltage Vz2 of the temperature detecting circuit on the gate terminal voltage. Therefore, an advantageous effect can be brought about that the upper value of the gate terminal voltage at which the overheating cutoff circuit is normally operated, can be increased to 18 V or higher from a conventionally-used voltage of 7 V or so.

Figure 11:
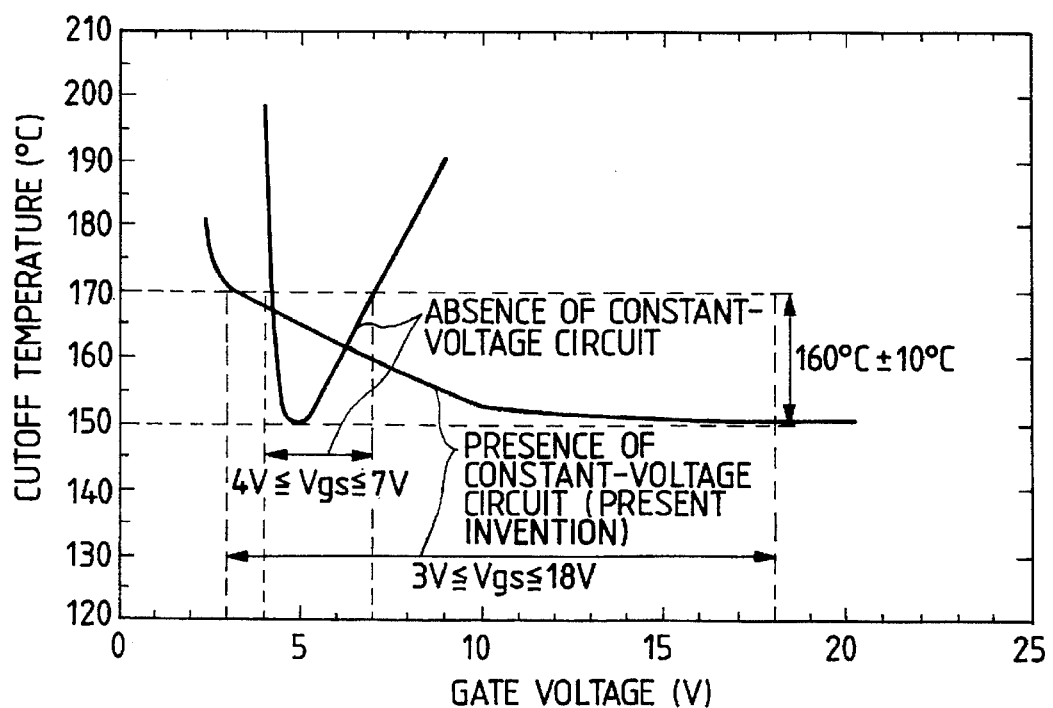
FIG. 11 is a view for describing a cutoff temperature characteristic of the semiconductor device according to the present invention.

FIG. 11 shows the dependence of cutoff temperature on gate terminal voltage at the time that the constant-voltage circuit exists in the circuit according to the present invention and does not exist in the conventional circuit. An advantageous effect can be brought about that a variation in the cutoff temperature is reduced at the time that the voltage at the external gate terminal has varied, owing to the incorporation of the constant-voltage circuit into the semiconductor device according to the present invention, and the reliability and the operability can be improved with an increase in the range of usable gate voltages. Described specifically, in the prior art, the cutoff temperature was changed to about 20° C. by simply varying the gate voltage by 3 V. In the present invention as well, a variation in the cutoff temperature at the same level does not take place until the gate voltage is changed to 10 V or more. Namely, according to the present invention, a variation in the cutoff temperature at the time that the gate voltage has been changed to 10 V, can be reduced to a temperature below 30° C. when manufacturing margins are taken into consideration. Thus, the operability and reliability can be improved because the same elements or devices can be used in both a 5-V power supply constant-voltage circuit and a 12-V power supply constant-voltage circuit.

A second feature of the present embodiment is that a resistance R0c is provided to set the output power supply voltage Vz2 of the temperature detecting circuit so as to be higher than the input power supply voltage Vz1 of the temperature detecting circuit. Even when the voltage at the external gate terminal is reduced to about 3 V, it is necessary to hold Vz1 at a low constant voltage so that the overheating cutoff circuit can be normally operated. On the other hand, a voltage higher than Vz1 must be applied to the gate of a MOSFET M2 as the voltage Vz2 to activate the latch circuit at a high speed.

The present embodiment has the third feature in that a channel length of the temperature detecting MOSFET M1 is longer than that of the MOSFET M6 for gate cutoff circuit. Namely, the channel length of the M1 is made longer so as to sufficiently reduce a variation in the threshold voltage for purpose of improving the accuracy of temperature detection, whereas the channel length of the M6 in which the variation in the threshold voltage has a small influence on a variation in the cutoff temperature, is made smaller to increase the current drivability. Thus, an advantageous effect can be obtained that the area of the protection circuit section can be reduced the accuracy of the cutoff temperature while prevention a reduction in. Incidentally, the same advantageous effect as above can be brought about even when the threshold voltage of M6 is set so as to be lower than that of M1.

A fourth feature of the present embodiment is that the temperature detecting diodes D3a through D3g are provided between the gate and source of the MOSFET M1 for the temperature detecting circuit but rat between the gate and drain of the MOSFET M1. When the Vz1 varies according to variation in the gate terminal voltage, this variation appears as a variation in the voltage across the resistance R1, which is other than a variation in the voltage across the diodes D3a through D3g. Therefore, the present embodiment permits a reduction in the dependence of the cutoff temperature on the gate voltage as compared with the conventional circuit (described in Japanese Patent Laid-Open Publication No. 63(1988)-229758).

A fifth feature of the present embodiment is that a resistance R0b is provided to set a power supply voltage Vz3 used for a gate voltage of the MOSFET M6 for the gate cutoff circuit so as to become higher than the output power supply voltage Vz2 of the temperature detecting circuit [R0a may be set equal to 0 (i.e., R0a =0)]. Thus, an advantageous effect can be obtained that the response speed of the gate cutoff circuit can be rendered fast.

A sixth feature of the present embodiment is that polycrystalline silicon diodes D5, D6 and D7 are provided to prevent a drain-to-body parasitic diode of each of the MOSFETs M1 through M7 for the protection circuit from being biased in the forward direction even if the gate terminal voltage becomes negative, and a current path extending through D0a to D0d is provided to prevent the polycrystalline silicon diodes D5, D6 and D7 from breaking down.

Figure 5:
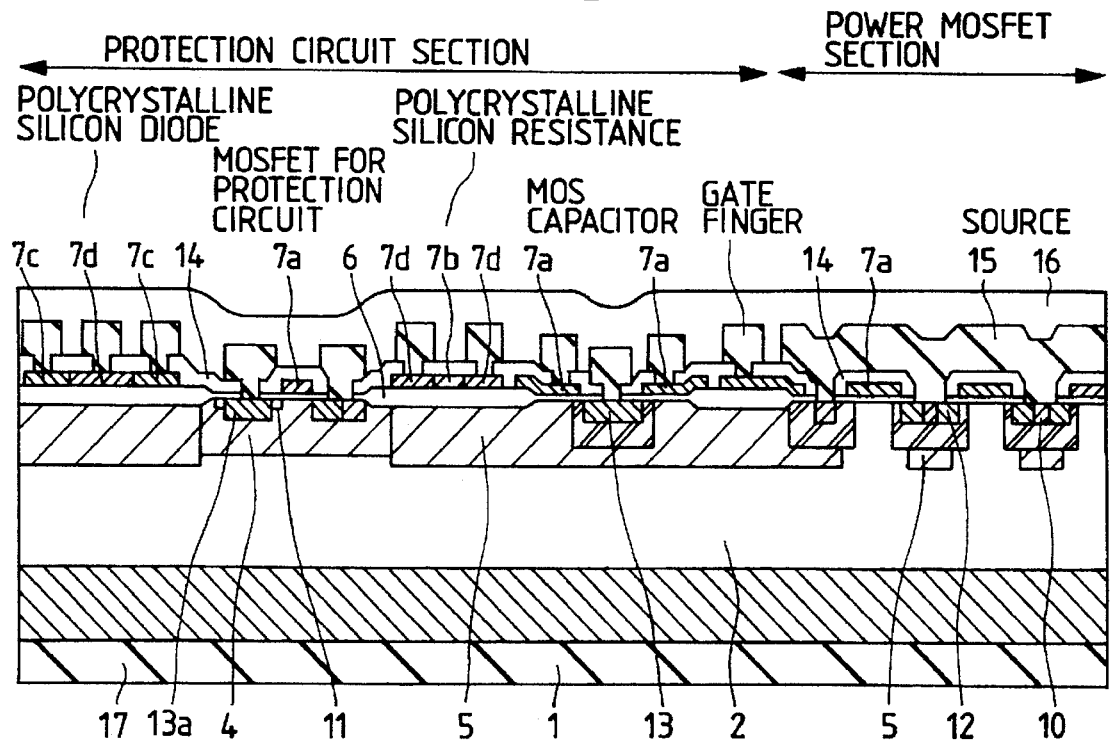
FIG. 5 is a sectional structural view taken along line a—a' of FIG. 2.

When the drain-to-body diode (corresponding to a pn junction diode composed of an n-type region 13a and a p-type region 4 shown in FIG. 5) of the MOSFET for the protection circuit is biased in the forward direction, a problem arises that a parasitic npn transistor with the drain (corresponding to an n-type region 2 shown in FIG. 5) of the power MOSFET as the collector is operated so that a current flows from the drain terminal to the gate terminal. A problem comes up in that where the polycrystalline silicon diodes D5 through D7 are simply added to prevent the current from flowing between the gate and the drain, the above parasitic npn transistor is eventually activated when a negative voltage greater than or equal to the withstand voltage of each diode is applied to the external gate terminal (e.g., Vgs= about −10 V or less). The point of the present embodiment is that a current path different from the MOSFET for the protection circuit is provided between the external source terminal and the external gate terminal to prevent the parasitic diode of the MOSFET from being forward-biased without preventing the current from flowing from the external source terminal to the external gate terminal (the gate protection circuit is used as the current path in the present embodiment). In order to realize it, the withstand voltages of the diodes D5 through D7 and D0a through D0d and the forward voltages developed across the diodes are set so as to meet the following conditions:

$$BV(D5), BV(D6), BV(D7) > Vf(D0a) + BV(D0b) + Vf(D0c) + Vf(D0d)$$

where

BV(D0b)=4 V,
BV(D5)=BV(D6)=BV(D7)=7 V,
Vf(D0a)=Vf(D0c)=Vf(D0d)=0.3 V

The length of a low-density p-type polycrystalline silicon layer 7b may be shortened to set the breakdown voltage of the D0b to the voltage lower than that of each of the D5, D6 and D7.

A seventh feature of the present embodiment is that a MOSFET M5 for the protection circuit is provided to stabilize the latch circuit. A problem arises that although the present circuit is originally operated even without M5, the latch circuit tends to cause an unstable latched state because the loads provided in the latch circuit are resistors. In the present embodiment, when the cutoff circuit is operated owing to the additional provision of the M5 and the output voltage of the latch circuit begins to take a high potential, M5 is turned on so that positive feedback is effected on a cutoff operation. That is, an advantageous effect is obtained that the gate voltage of the MOSFET M1 for the temperature detecting circuit is further reduced so that the voltage inputted to the latch circuit is further increased, thereby easily stabilizing the state of the latch circuit.

The additional provision of M5 can also bring about the following effects. When a load includes an inductance component, there is a situation in which the external drain voltage instantaneously becomes lower than the external source voltage after the overheating cutoff circuit has been operated. At this time, the parasitic npn transistor in which the drain (n-type region 13a shown in FIG. 5) of each of the MOSFETs M1 through M7 for the protection circuit is used as the collector, the body (p-type region 4 shown in FIG. 5) is used as the base and the drain (n-type region 2 shown in FIG. 5) of the power MOSFET is used as the emitter, is operated so that drain voltages of M1 and M4 are reduced. In the worst case, information stored in the latch circuit is erased. Thereafter, when the external drain voltage goes high, the cutoff circuit must be operated where the chip temperature becomes greater than or equal to the cutoff temperature. In the present circuit, M1 can be turned on deeper owing to the additional provision of M5 because the drain voltage of M5 is also reduced under the influence of the parasitic npn transistor when the voltage at the external drain terminal of the power MOSFET becomes negative. Thus, the cutoff circuit is easy to operate at a high speed.

Incidentally, the present embodiment shows a case where the drain of M5 has been connected between D3e and D3f. If the positive feedback acts when the cutoff circuit starts to operate, then the drain of M5 may be connected to other places. Such places include the gate of M1, points where the polycrystalline silicon diodes D2a through D2f of the constant-voltage circuit are connected to one another, etc., for example.

An eighth feature of the present invention is that a malfunction-preventing capacitor C is internally provided. Thus, when the gate voltage rapidly rises, M2 is turned on to prevent the cutoff circuit from malfunctioning. The capacitor C involves a problem that although the capacitor C effectively prevents noise from being produced out of the gate if the capacitor C is directly connected to the drain of M1, the response speed of the cutoff circuit is reduced when the chip is subjected to a high temperature. Therefore, the capacitor C is electrically connected to an intermediate point between R2a and R2b so as to obtain the optimization.

Figure 2:
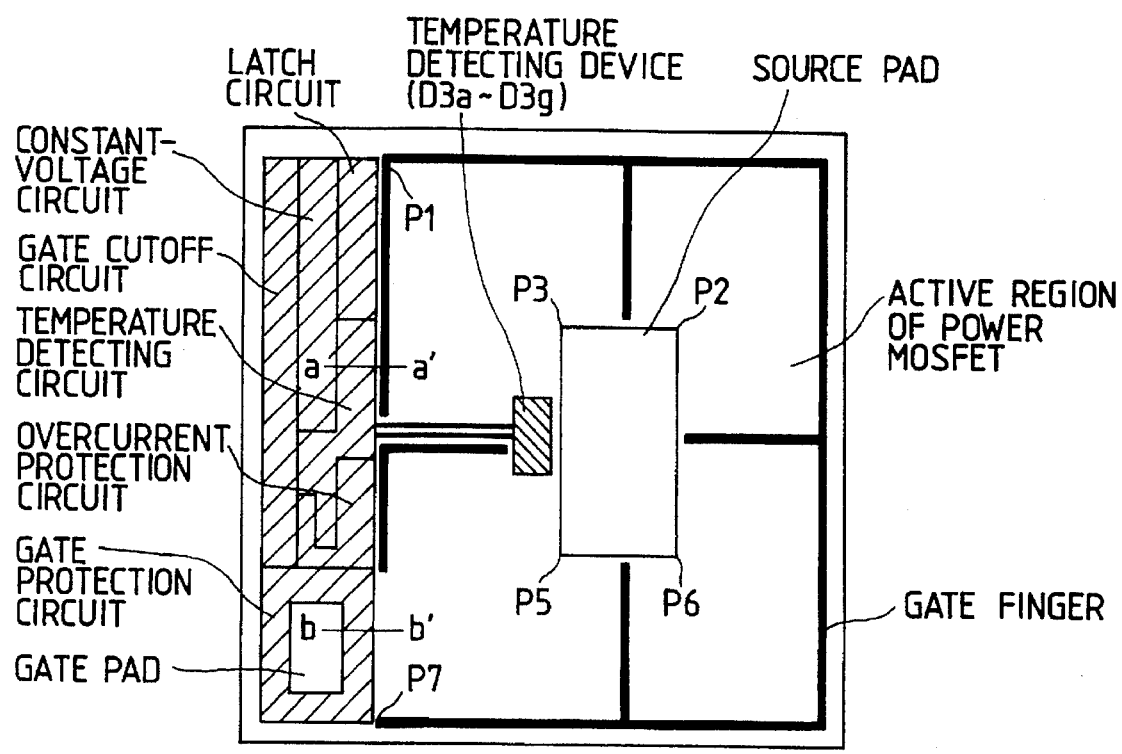
FIG. 2 is a view for describing a planar structure of the semiconductor device shown in FIG. 1.

FIG. 2 is a view for explaining a planar structure of the semiconductor device according to the first embodiment of the present invention.

A ninth feature of the present embodiment is that the temperature detecting element or device is disposed in the vicinity of a source pad (so as to fall within 300 μm). Here, the temperature detecting device is used to detect the temperature because a variation in the voltage, resistance value or current conspicuously occurs with an increase in temperature. In the present embodiment, the polycrystalline silicon diodes D3a through D3g are used as the temperature detecting device.

The maximum temperature of the power MOSFET has heretofore been considered to be shown in the center of an active region. This, however, corresponds to the case where the rate of increase in the temperature of the chip has been set so as to be considerably slower than a temperature transfer rate in the chip. It was found that the temperature has risen to the maximum in the vicinity of the source pad when heat was generated with a rapid increase in the drain current like troubles such as a short circuit in a load, etc. Therefore, the temperature detecting diodes are disposed in close vicinity to the source pad rather than disposed on the side of a temperature detecting circuit section comprised of M1, etc. (see FIG. 1).

A tenth feature of the present embodiment is that the source pad is disposed in a position spaced 300 μm or more away from the periphery of the chip. This arrangement is made to reduce the density of current flowing in the source electrode, avoid a local increase in the temperature and prevent an on-resistance of the source electrode from increasing.

An eleventh feature of the present embodiment is that the temperature detecting diodes are disposed (within a region surrounded by P1, P2, P3, P5, P6 and P7) between the protection circuit section other than the temperature detecting diodes and the source pad. Since an electrode on the surface of the chip is formed as one layer, it is necessary for a normal power MOSFET process to fabricate the source electrode of the power MOSFET and wires or conductors used for the temperature detecting diodes or the like with this metallic electrode layer formed in one layer. By forming the temperature detecting diodes within the region between the protection circuit section other than the temperature detecting diodes and the pad for the external source terminal, the temperature detecting diodes can be brought close to the source pad at which the temperature most readily increases within the semiconductor chip when the short circuit in the load takes place, and at the same time the source electrode of the power MOSFET becomes hard to be cut, thereby making it possible to prevent a source resistance from increasing. In order to prevent the source resistance from increasing, a gate finger (corresponding to a metallic electrode layer for reducing a gate resistance) is wired so as to cover the active region of the power MOSFET and is disposed toward the source pad.

A twelfth feature of the present embodiment is that gate protecting or protective diodes are formed around a gate pad so as to cover the gate pad, and they are also disposed at the corner of the protection circuit section. Thus, since wires or conductors used for the protection circuit other than the temperature detecting diodes and the gate protection circuit can be prevented from being obstructed by the gate pad, an increase in the area of the chip can be reduced.

Figure 3:
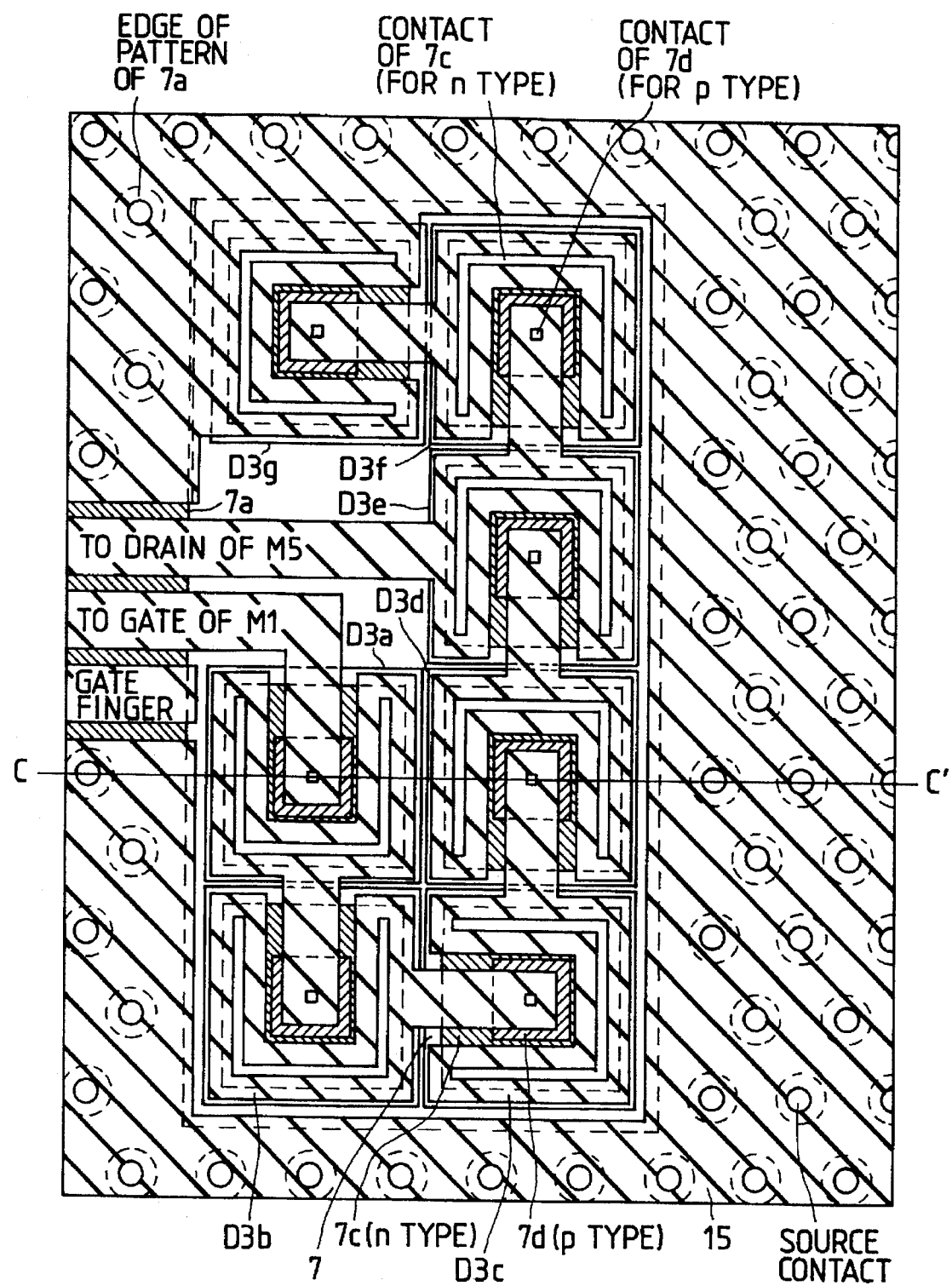
FIG. 3 is a view for describing a planar structure of a temperature detecting device section employed in the semiconductor device shown in FIG. 1.
Figure 4:
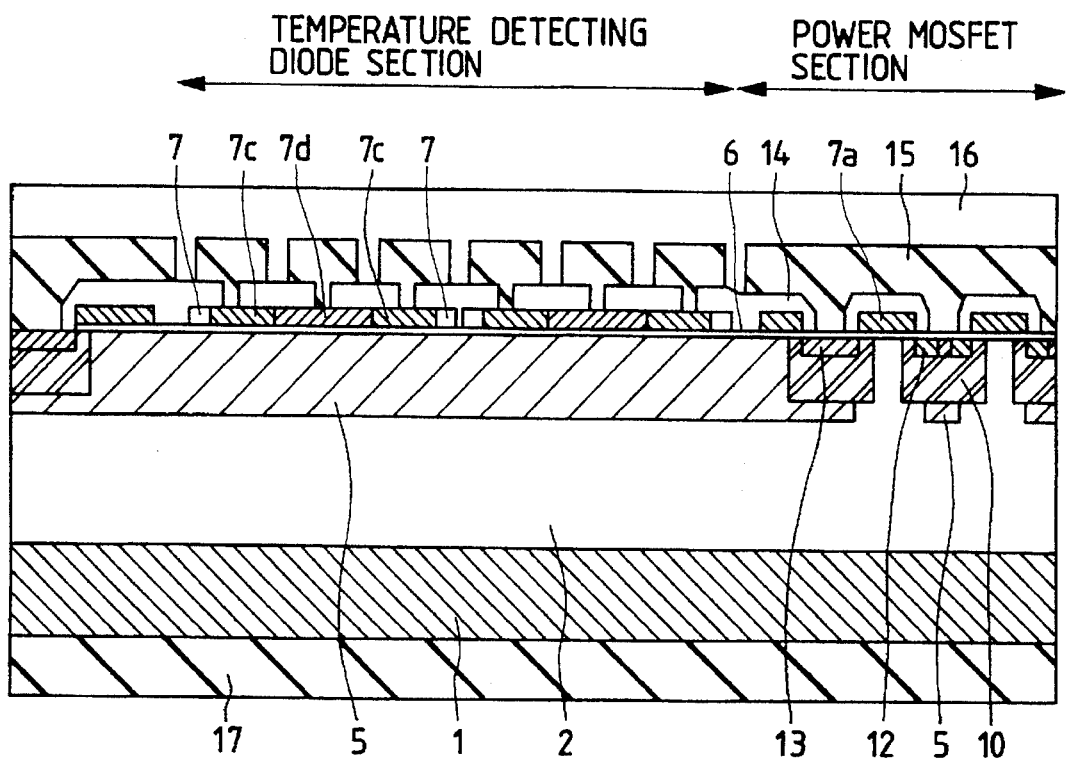
FIG. 4 is a sectional structural view taken along line c—c' of FIG. 3.

FIG. 3 is a view for describing a planar structure of a temperature detecting device section employed in the semiconductor device according to the first embodiment of the present invention. FIG. 4 is a sectional structural view taken along line c—c' of FIG. 3. Reference numeral 1 indicates a high-density n-type semiconductor substrate. Reference numeral 2 indicates n-type epitaxial layers which form the drain of the power MOSFET. Reference numeral 7a indicates the gate of the power MOSFET. Reference numeral 12 indicates a high-density n-type region which forms the source of the power MOSFET. Reference numeral 10 indicates a p-type region which forms the body in which a channel for the power MOSFET is formed. Reference numeral 5 indicates a high-density p-type region formed to reduce parasitic npn transistors which exist between the source, body and drain of the power MOSFET. Further, the high-density p-type region 5 is also formed just below the temperature detecting diodes and prevents parasitic devices or elements resulting from n-type reversion of the p-type region 5 provided just below the temperature detecting diodes from being operated. Designated at numeral 13 is a high-density p-type region formed to electrically connect the body 10 of the power MOSFET to the source under a low resistance.

A thirteenth feature of the present embodiment is that an anode (corresponding to a p-type polycrystalline silicon layer 7d) of each temperature detecting diode and its cathode (corresponding to an n-type polycrystalline silicon layer 7c) are shaped in ring form. Therefore, an advantageous effect can be brought about that factors creating an increase in leakage current at an end of a pn junction and an increase in variations of a temperature characteristic can be eliminated. Incidentally, the pn junction has been shaped in the form of a square in FIG. 3. However, an advantageous effect can be obtained that if the square is changed to a circular arc or an obtuse-angled shape, then an increase in junction current at the corner can be further reduced.

A fourteenth feature of the present embodiment is that an insulative layer 6 just below the temperature detecting diodes is fabricated on a thin oxide film having a length of about 100 nm or less, which is a level identical to a gate oxide film of the power MOSFET, and patterns for the p-region polycrystalline silicon diode 7d and the n-type polycrystalline silicon diode 7c are respectively formed only within an inner region separated from both sides of a polycrystalline silicon layer 7. In the present embodiment, a boron-ion implantation step for forming the p-region polycrystalline silicon diode 7d is performed simultaneously with a boron-ion implantation step for the p-type region 13, whereas a step for forming the n-type polycrystalline silicon diode 7c is executed simultaneously with an arsenic (or phosphorous)-ion implantation step for an n-type region 12. Therefore, if the pattern for the n-type polycrystalline silicon diode 7c extends up to the outside of the polycrystalline silicon layer 7, n-type regions for floating are formed in the p-type region 5 provided around each polycrystalline silicon diode in accordance with the arsenic (or phosphorous)-ion implantation step. Therefore, this extension process is not preferable. The thin insulative layer is used just below the temperature detecting diodes because the rate of transferring heat from the drain region 2 of the power MOSFET is rendered faster. However, the insulative layer may be formed on a thick region of the oxide film 6, like the polycrystalline diodes for the constant-voltage circuit shown in FIG. 5, when it is unnecessary to make the heat transfer rate faster.

Figure 6:
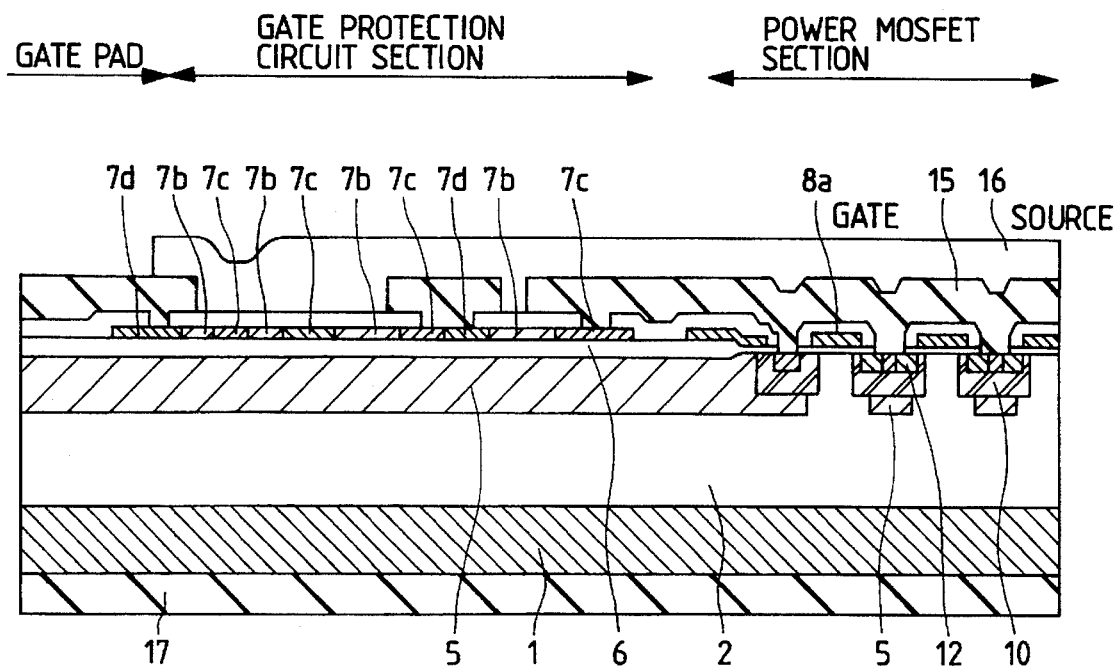
FIG. 6 is a sectional structural view taken along line b—b' of FIG. 2.

FIG. 5 is a sectional structural view taken along line a—a' of FIG. 2. FIG. 6 is a sectional structural view taken along line b—b' of FIG. 2. The polycrystalline silicon diodes shown in FIG. 5 take structures of devices or elements used for the constant-voltage circuit, like D2a through D2f shown in FIG. 1.

A fifteenth feature of the present embodiment is that each of the polycrystalline silicon diodes for the constant-voltage circuit which uses a forward voltage drop, is formed by directly connecting the high-density n-type polycrystalline silicon layer 7c and the high-density p-type polycrystalline silicon layer 7d to one another and ring-shaping them in a manner similar to the temperature-detecting polycrystalline silicon diodes. An advantageous effect can be brought about that parasitic resistive components can be reduced by directly connecting the high-density regions to each other and factors creating an increase in leakage current at an end of a pn junction and an increase in variations of a temperature characteristic can be eliminated by shaping the high-density regions in a ring manner. When the pn junction shaped in the form of the square as given by the description of the temperature detecting diodes is shaped in the form of the circular arc or the obtuse-angled shape, an advantageous effect can be obtained that an increase in junction current at the corner can be further reduced.

Figure 10:
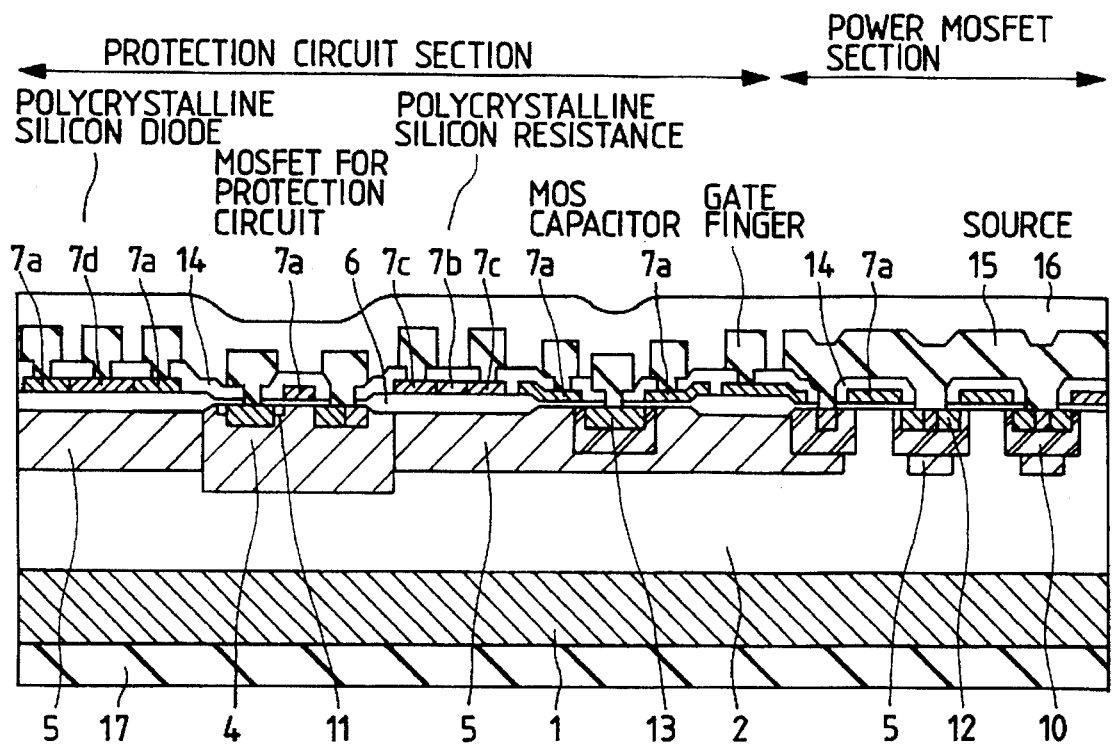
FIG. 10 is a view for describing a sectional structure of a semiconductor device according to a third embodiment of the present invention.

A sixteenth feature of the present embodiment is that a MOS capacitor shown in FIG. 10 is used as the capacitor shown in FIG. 1 and a p-type region 5 whose surface density is higher than that of a p-type region 4 of the MOSFET for the protection circuit is used just below the gate oxide film. Thus, even when a voltage applied to the polycrystalline silicon layer 7a goes high, the surface of the p-type region 5 is prevented from being subjected to n-type reversion and its resistance is prevented from increasing (see FIGS. 8(a) and 8(b)). Further, a parasitic resistance, which exists in the p-type region 5, can be reduced by forming the p-type region 13 so as to be covered with the polycrystalline silicon layer 7a for the capacitor.

A seventeenth feature of the present embodiment is that a latch-type overheating protection circuit for cutting off the power MOSFET when the semiconductor chip reaches a predetermined temperature (e.g., 140° C.) or higher and thereafter holding a cutoff state as it is even when the chip is cooled to room temperature, and an overcurrent protection circuit for restricting the drain current of the power MOSFET to a predetermined current or less, are provided as shown in FIG. 1. According to the present circuit configuration, since the overcurrent protection circuit is internally provided, the rate of increase in the temperature of the semiconductor chip can be delayed when undesired or improper conditions such as a short-circuit in a load, etc. are encountered. Therefore, an advantageous effect can be obtained that before the overheating protection circuit is operated, the elements or devices can be prevented from leading to permanent destruction. Since the overheating protection circuit is of a latch type, the cutoff state is held when the cutoff circuit is operated due to defective or improper conditions developed in the load and the like. It is therefore possible to bring about an advantageous effect that the cause of the malfunction is easy to be diagnosed. In order to reset or clear the cutoff state in the present circuit, a gate voltage is reduced to near zero volts so that the latch circuit is reset.

Figure 7A:
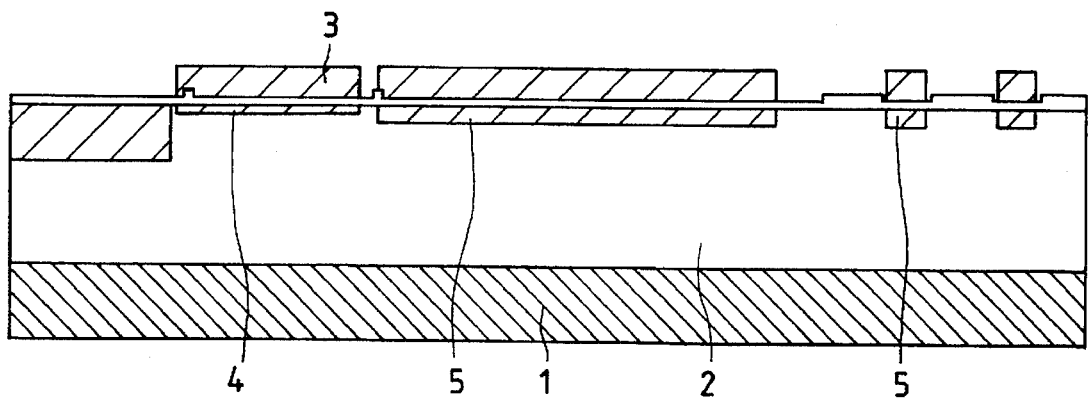
FIGS. 7(a), 7(b) and 7(c) are respectively views for describing steps of fabricating the semiconductor device shown in FIG. 1.
Figure 7B:
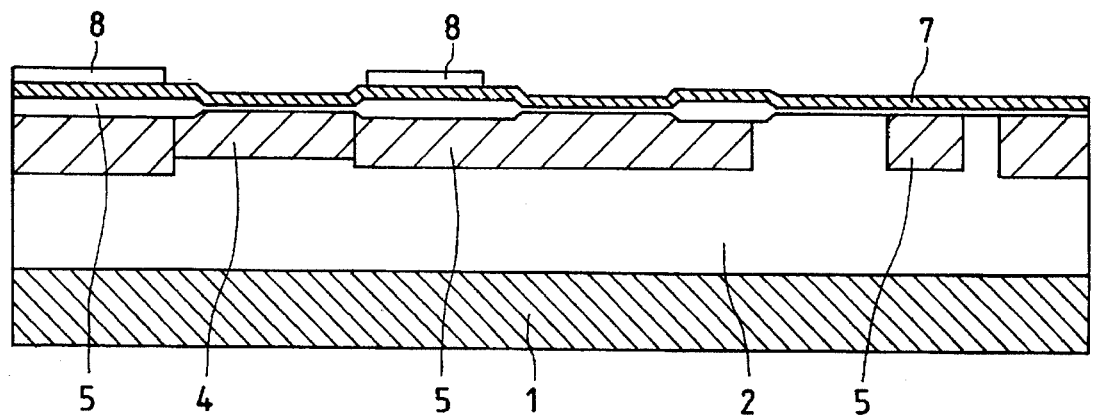
Figure 7C:
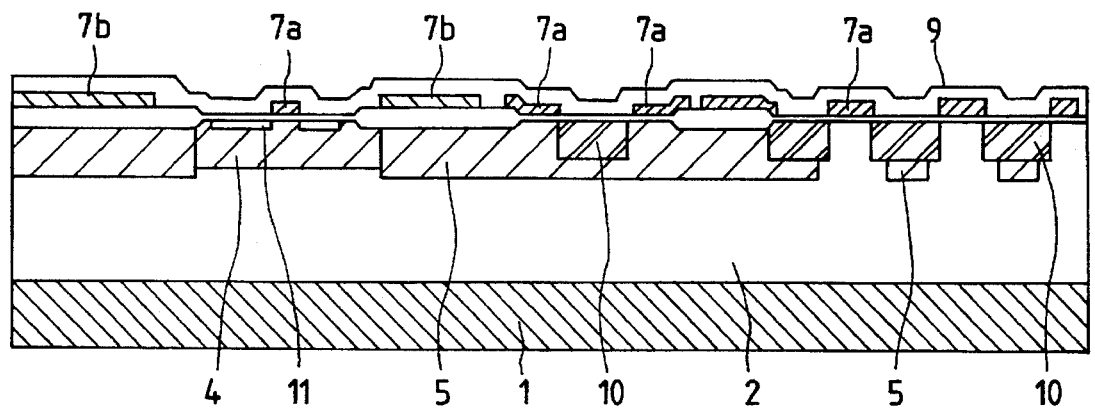
Figure 8A:
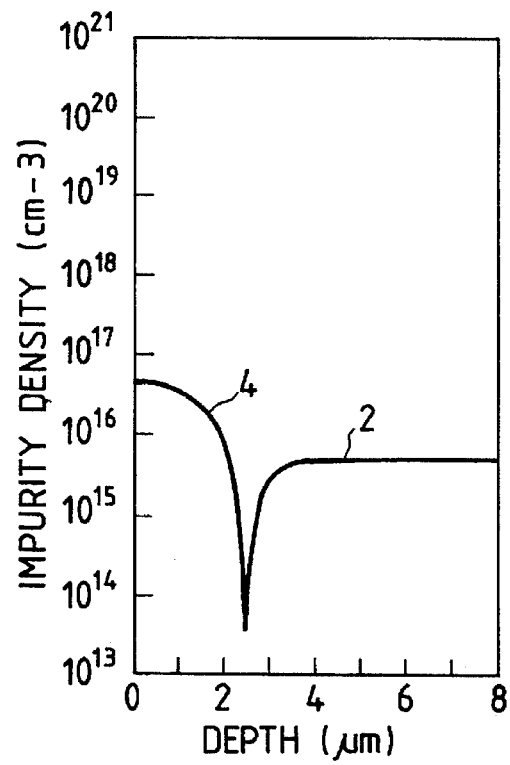
FIGS. 8(a) and 8(b) are respectively impurity profiles obtained from the semiconductor device shown in FIG. 1.
Figure 8B:
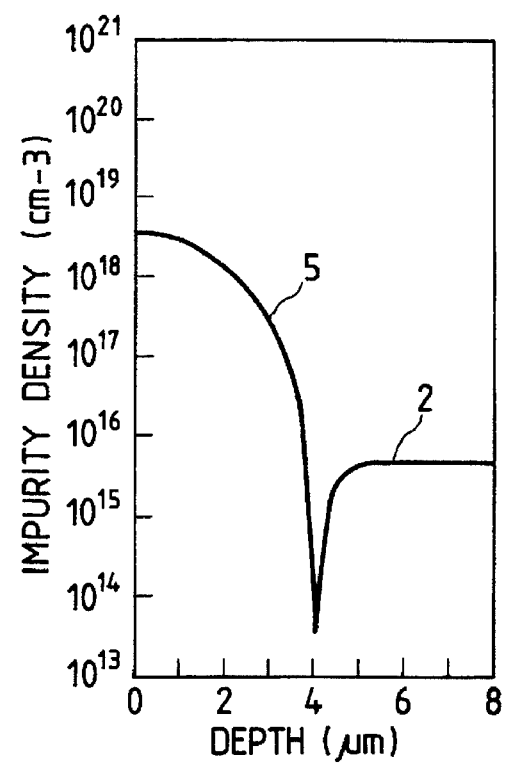

FIGS. 7(a) to 7(c) are respectively views for describing steps for fabricating the semiconductor device according to the first embodiment of the present invention, and are respectively sectional structural views for describing a principal process of obtaining a structure shown in FIG. 5. FIGS. 8(a) and 8(b) are respectively an impurity profile of a p-type well 4 of a MOSFET for a protection circuit and an impurity profile of a p-type region 5 used just below each of a p-type well region of a power MOSFET and a capacitor. The p-type region 5 is set to a high density by increasing the degree or depth of boron-ion implantation by about one figure as compared with the p-type region 4.

A method of fabricating the semiconductor device will be summarized below.

(1) An n-type epitaxial layer 2 is fabricated on a high-density n-type substrate 1, and an insulative layer 3 is thereafter formed on the n-type epitaxial layer 2. The resultant product is used as a mask and is subjected to boron-ion implantation and diffusion to produce the p-type regions 4 and 5 {FIG. 7(a)}.

(2) After the insulative layer 3 has been removed, an insulative layer 6 is formed on the product free of the insulative layer 3 in accordance with a selective-oxidation and gate-oxidation step using a nitride film. Next, a polycrystalline silicon layer 7 is fabricated on the insulative layer 6. Thereafter, an insulative layer 8 is formed on a region for producing polycrystalline silicon diodes and polycrystalline silicon resistances respectively having high resistance values {FIG. 7(b)}.

(3) A region, which is not protected by the insulative layer 8 on the polycrystalline silicon layer 7, is doped with an n-type impurity such as phosphorous or the like to form a region 7a. Next, the insulative layer 8 is removed and a p-type polycrystalline silicon layer 7b is fabricated by boron implantation. Thereafter, the polycrystalline silicon layers 7a and 7b are subjected to patterning and a p-type region 10 used for the purpose of principally forming a channel region of a power MOSFET is fabricated in self-alignment with the polycrystalline silicon layer 7a and subjected to diffusion. Further, a low-density n-type region 11 is formed in accordance with a phosphorous (or arsenic)-ion implantation step to make a MOSFET for a protection circuit that is resistant to a high voltage, after which an insulative layer 9 is formed thereon.

(4) Thereafter, a step for forming an n-type polycrystalline silicon diode 7c is performed simultaneously with a step for effecting the arsenic (or phosphorous)-ion implantation on the n-type region 12. Further, a boron-ion implantation step for forming a p-region polycrystalline silicon diode 7d is executed simultaneously with a step for effecting the boron-ion implantation on the p-region 13. Afterwards, an insulative layer 14 (including the insulative layer 9 and similarly shown in other drawings) is formed, and contacts, a metallic electrode layer 15, and an insulative layer 16 are formed. The underside of the product is etched and a back electrode 17 is formed. Finally, the product leads to the structure shown in FIG. 5.

Figure 9:
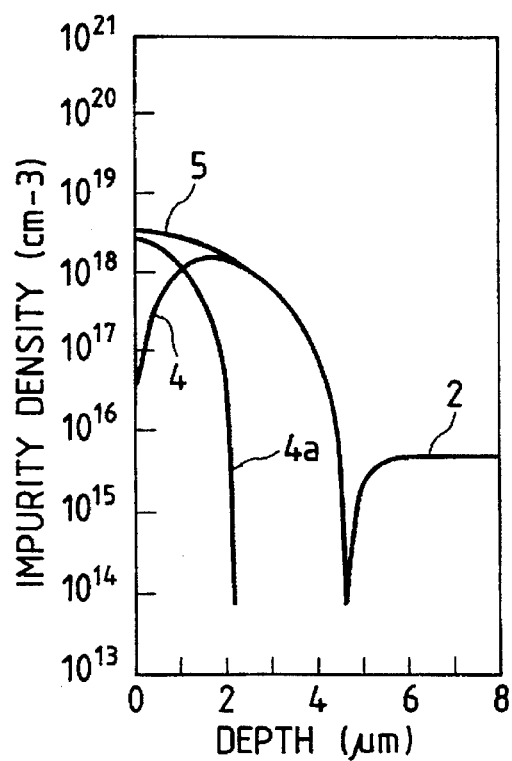
FIG. 9 is an impurity profile obtained from a semiconductor device according to a second embodiment of the present invention.

FIG. 9 shows an impurity profile obtained from a semiconductor device according to a second embodiment of the present invention. The present embodiment has a feature that a p-type region 4 corresponding to a body region of a MOSFET for a protection circuit is set to a retro-grade type profile in which an impurity density of a silicon's inside is increased by about one figure as compared with a surface density. Here, reference numeral 4a indicates a profile of an n-type diffusion layer for reducing a surface density at a profile [5] of a p-type diffusion layer with respect to 4a. Thus, a threshold voltage of the MOSFET for the protection circuit can be reduced to about 1.5 V or less in a manner similar to the first embodiment. Even if an external gate voltage is reduced to 3 V or so, a cutoff circuit can be operated. Further, an advantageous effect can be obtained that the effect of a parasitic npn transistor comprised of a drain and a body of the MOSFET for the protection circuit and a drain of a power MOSFET can be controlled.

FIG. 10 is a sectional structural view of a semiconductor device according to a third embodiment of the present invention. The present embodiment has a feature in that a p-type region 4 is formed so as to be deeper than a p-type region 5. Thus, the effect of a parasitic npn transistor comprised of a drain and a body of a MOSFET for a protection circuit and a drain of a power MOSFET can be controlled while a threshold voltage of the MOSFET for the protection circuit remains reduced to about 1.5 V or less in a manner similar to the first embodiment.

Figure 12:
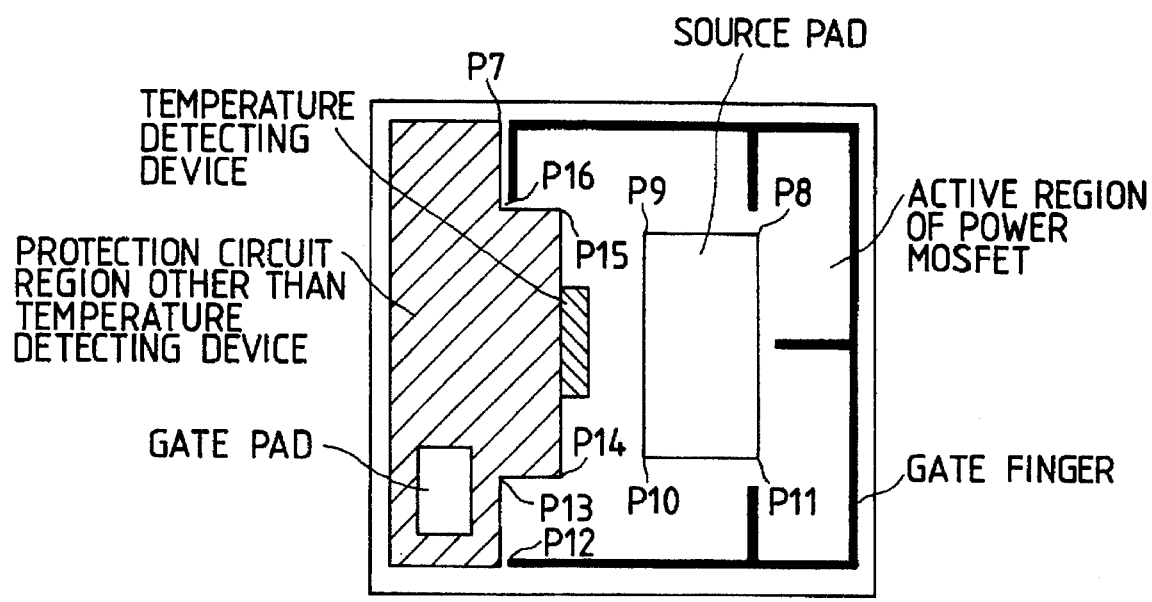
FIG. 12 is a view for describing a planar structure of a semiconductor device according to a fourth embodiment of the present invention.

FIG. 12 is a plan view of a semiconductor device according to a fourth embodiment of the present invention. The present embodiment is also constructed in a manner similar to the first embodiment such that a temperature detecting element or device is disposed (within a region surrounded by P7, P8, P9, P10, P11, P12, P13, P14, P15 and P16) between a protection circuit region other than the temperature detecting device and a source pad. In the present embodiment as well, the protection circuit region other than the temperature detecting device is shaped in the form of a polygon having four or more corners because the temperature detecting device is brought close to a chip-temperature maximizing region while a source electrode resistance remains reduced.

Figure 13:
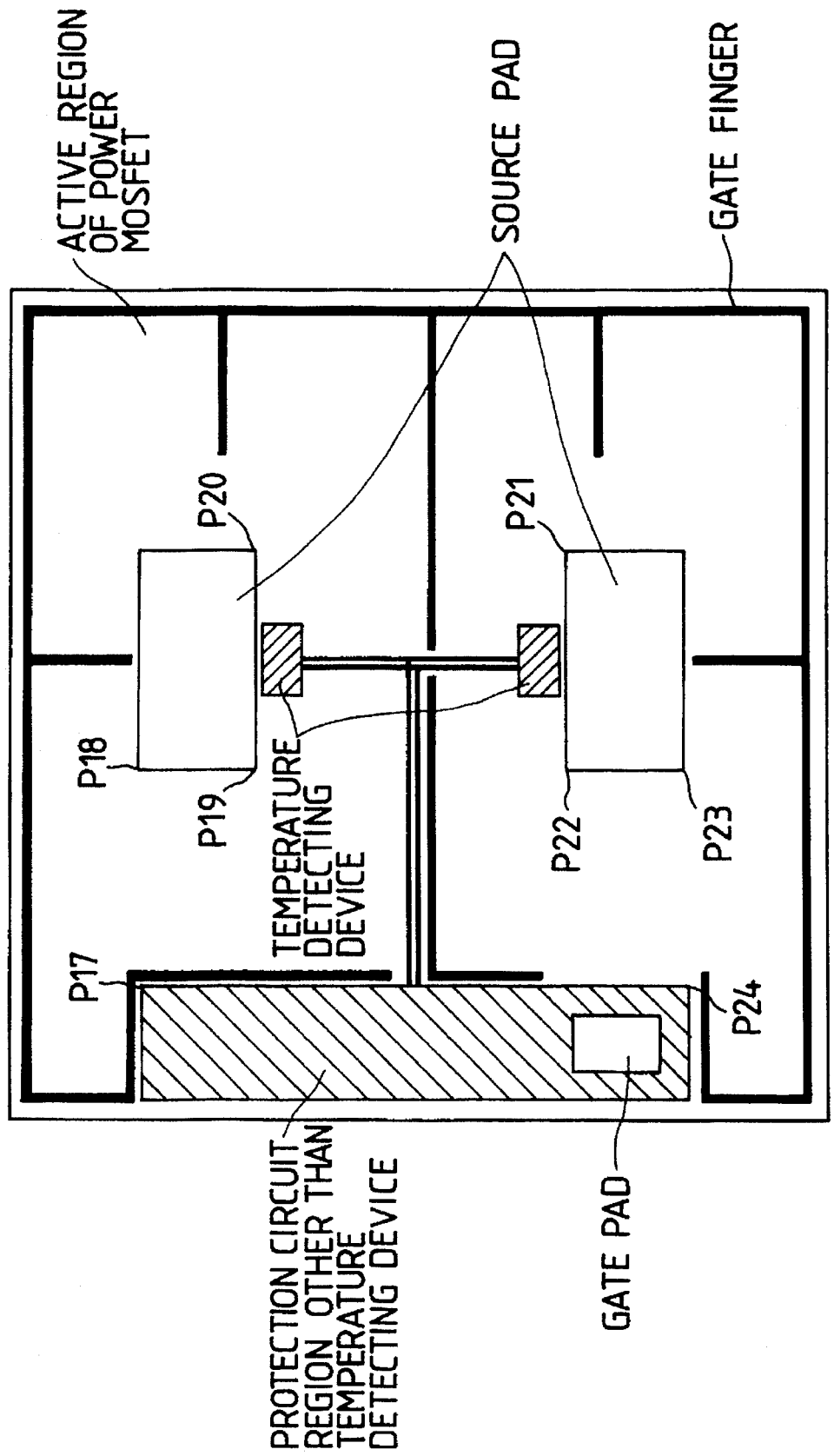
FIG. 13 is a view for describing a planar structure of a semiconductor device according to a fifth embodiment of the present invention.

FIG. 13 is a plan view of a semiconductor device according to a fifth embodiment of the present invention. The present embodiment shows one example in which temperature detecting elements or devices are laid out under the existence of a plurality of source pads. The present embodiment is also constructed in a manner similar to the first embodiment such that each of the temperature detecting elements is disposed (within a region surrounded by P17, P18, P19, P20, P21, P22, P23 and P24) between a protection circuit region other than the temperature detecting elements and a source pad. The temperature detecting device may be disposed in one place. However, the temperature detecting devices were situated in two positions in the present embodiment to enhance the accuracy of temperature detection. In the case of the circuit shown in FIG. 1, the diodes may be divided into two groups, i.e., a group of D3a, D3b, D3c and D3g and a group of D3d, D3e and D3f so as to be disposed in two positions.

Figure 14:
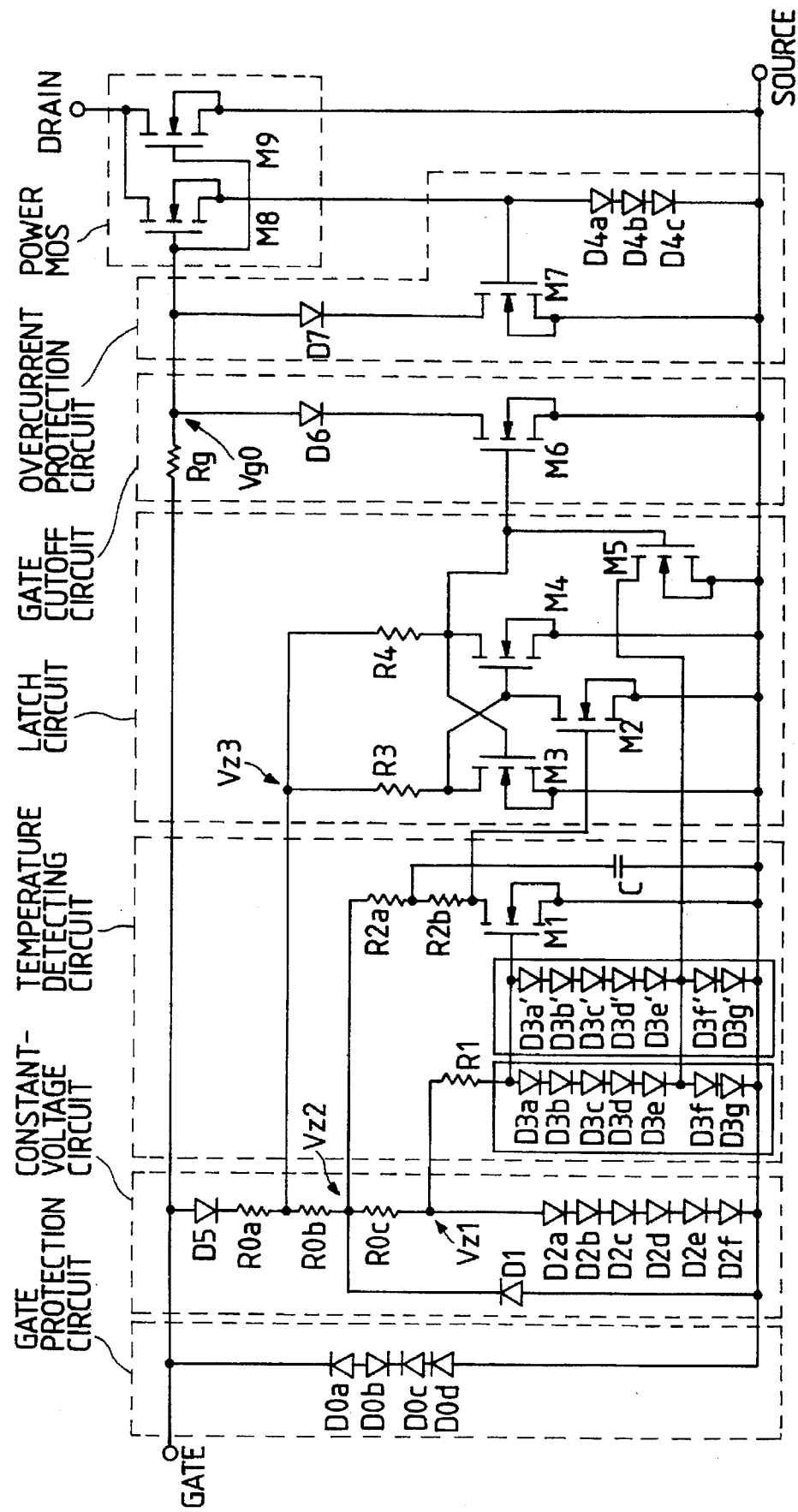
FIG. 14 is a circuit diagram showing a semiconductor device according to a sixth embodiment of the present invention.

FIG. 14 is a circuit diagram showing a semiconductor device according to a sixth embodiment of the present invention. The present embodiment shows a circuit in which temperature detecting elements or devices are disposed in two or more positions spaced away from each other as shown in FIG. 13. Of course, the present embodiment shows a case where temperature detecting diodes are arranged in parallel to improve the accuracy of temperature detection.

Figure 15:
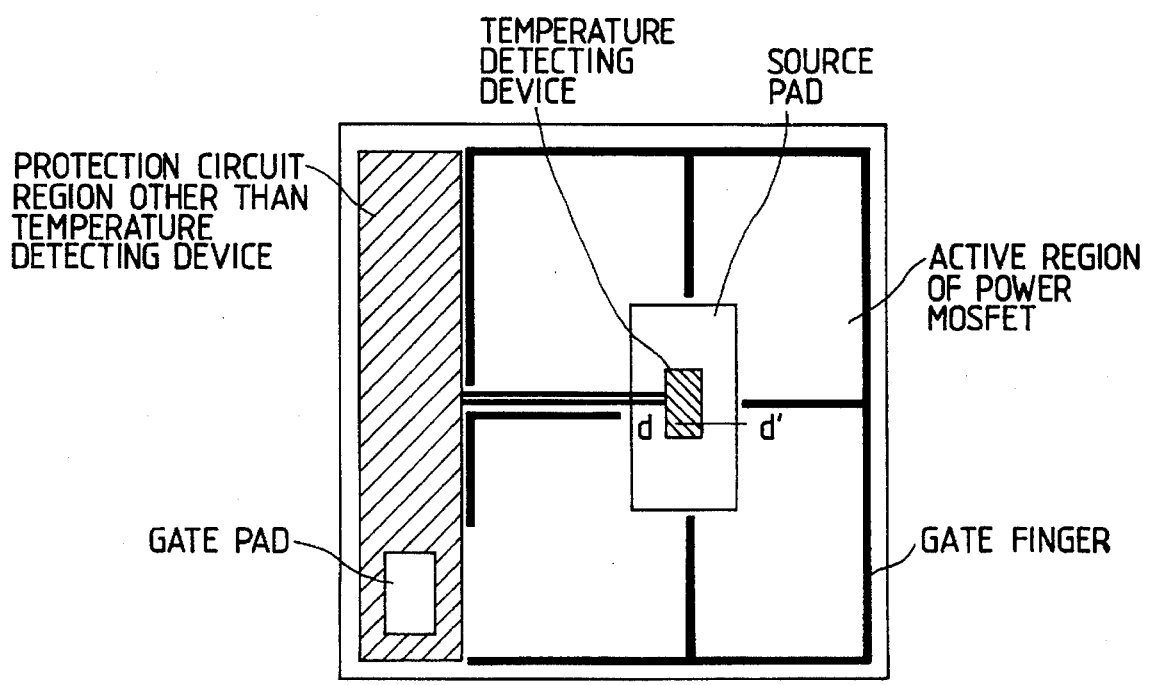
FIG. 15 is a view for describing a planar structure of a semiconductor device according to a seventh embodiment of the present invention.

FIG. 15 is a plan view illustrating a semiconductor device according to a seventh embodiment of the present invention. The present embodiment has a feature that temperature sensing diodes are disposed just below a source pad that provides the maximum chip temperature upon occurrence of a short circuit in a load.

Figure 16:
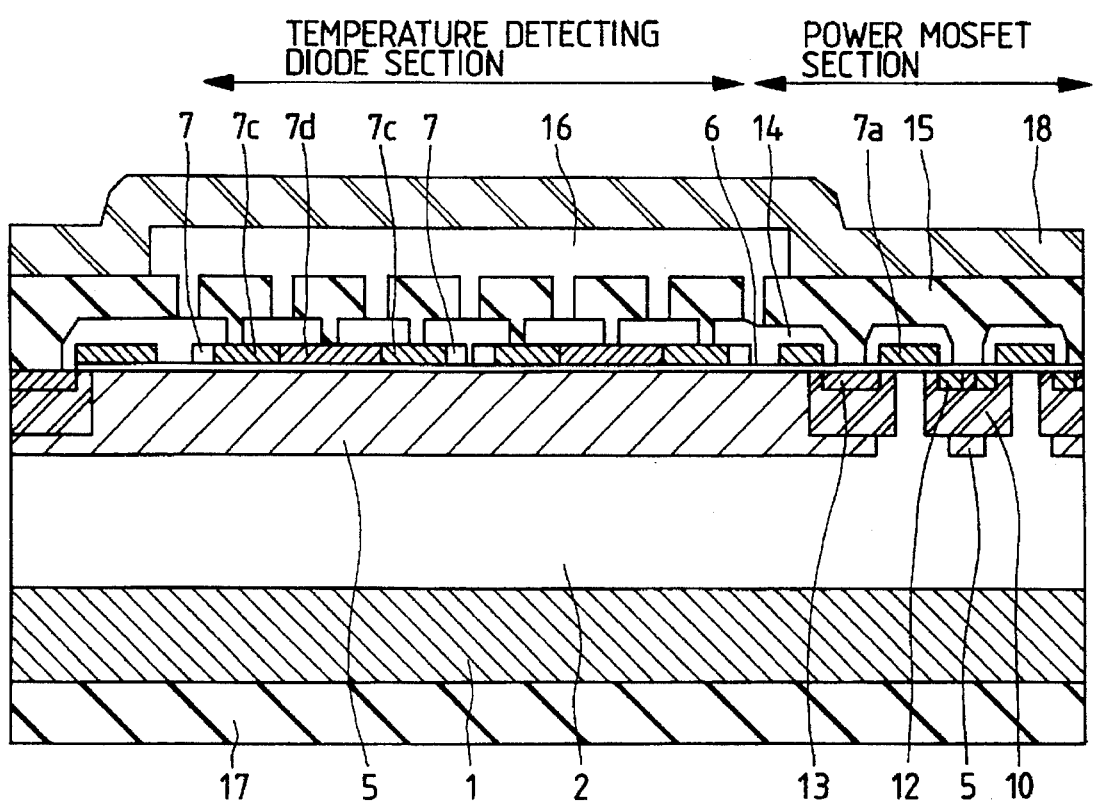
FIG. 16 is a sectional structural view taken along line d—d' of FIG. 15.

FIG. 16 is a sectional structural view taken along line d—d' of FIG. 15. The present embodiment is characterized by the formation of a second metallic electrode layer 18 on a protection circuit with an insulative layer 16 interposed therebetween. Therefore, a temperature detecting circuit can be disposed just below the source pad as shown in FIG. 15. Further, an advantageous effect can be obtained that the speed responsive to the detection of temperature becomes faster because heat generated in the second metallic electrode layer 18 is also transferred to the insulative layer 16 where the second metallic electrode layer 18 is formed on a temperature detecting device, i.e., so as to cover a temperature detecting diode section as in the present embodiment. Therefore, even when the temperature detecting device is not disposed just below the source pad, the heat response speed can be improved by additionally providing the second metallic electrode layer 18.

Figure 17:
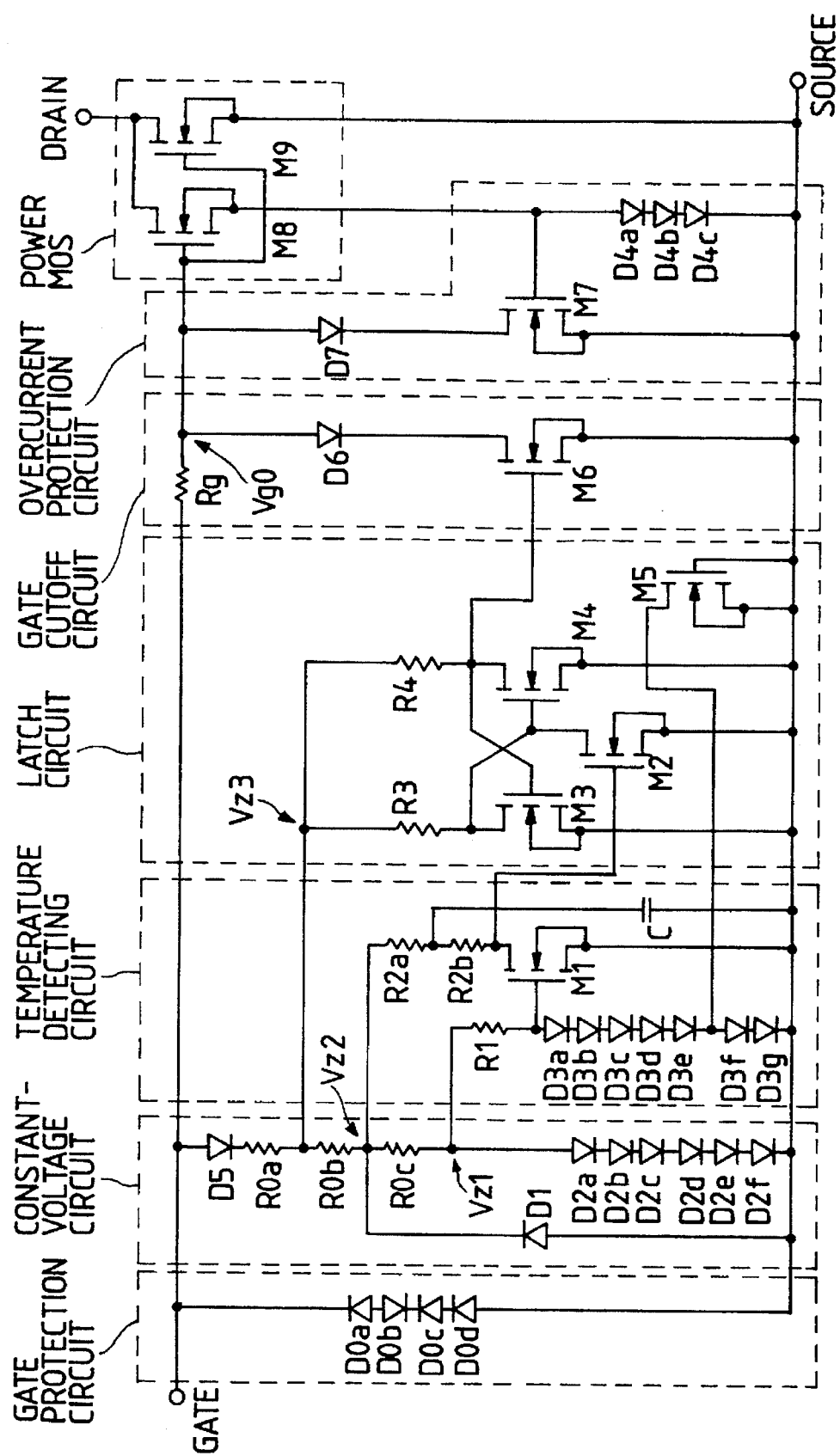
FIG. 17 is a circuit diagram illustrating a semiconductor device according to an eighth embodiment of the present invention.

FIG. 17 is a circuit diagram showing a semiconductor device according to an eighth embodiment of the present invention. The present embodiment is simply different from the first embodiment shown in FIG. 1 in the point where the gate terminal of M5 is connected. In the present embodiment, positive feedback is not exerted on the latch circuit as shown in FIG. 1. However, a second advantageous effect obtained by the addition of M5 as mentioned above can be brought about. Namely, the present circuit can bring about an effect that since the drain voltage of M5 is also reduced under the influence of the above npn transistor when the drain terminal of a power MOSFET becomes negative by the additional MOSFET M5, M1 can be turned off deeper. Therefore, a cutoff circuit is easy to operate at a high speed.

Figure 18:
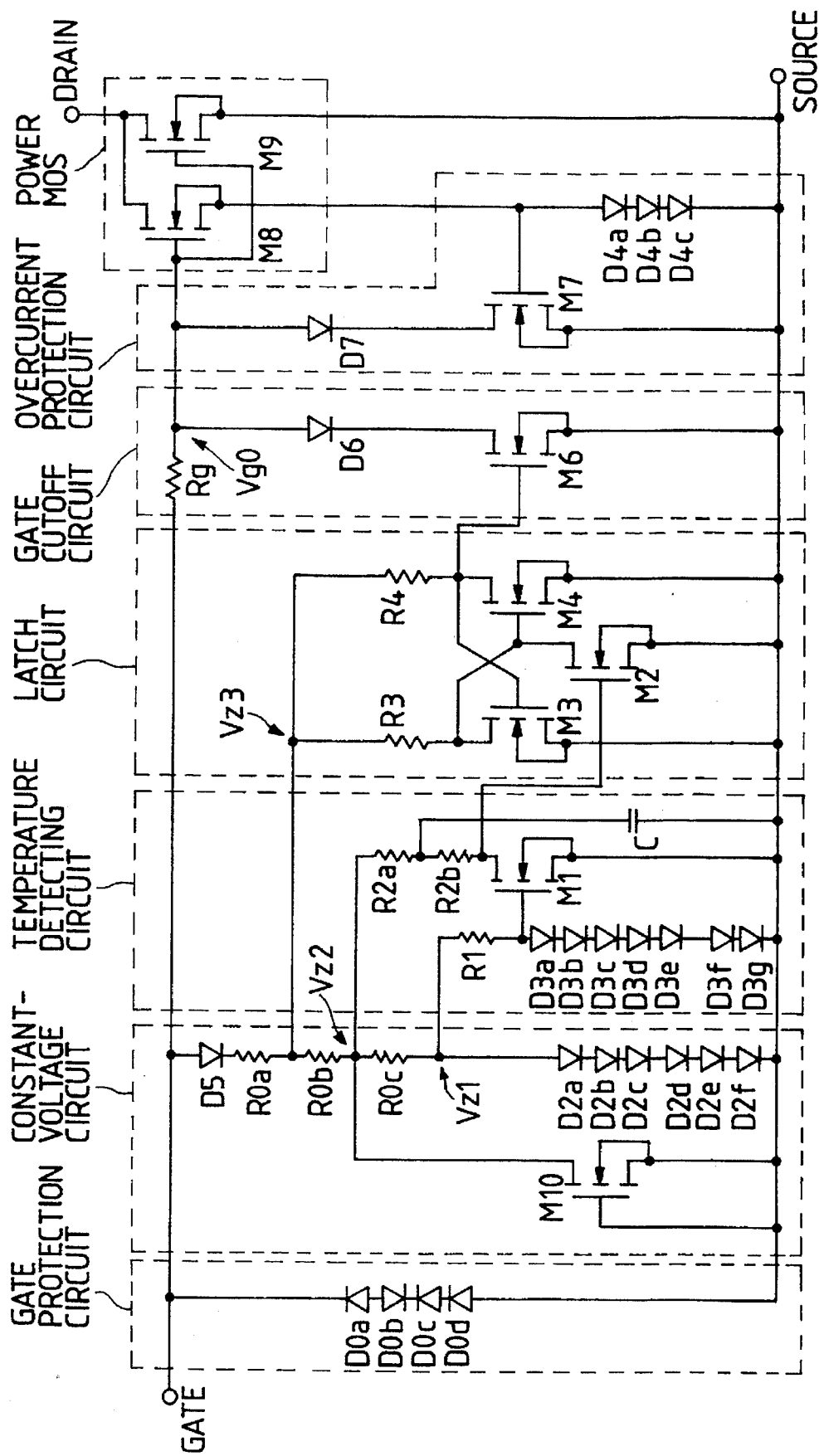
FIG. 18 is a circuit diagram showing a semiconductor device according to a ninth embodiment of the present invention.

FIG. 18 is a circuit diagram showing a semiconductor device according to a ninth embodiment of the present invention. A feature of the present embodiment is that the operation of M5 shown in FIG. 17 is effected by a MOSFET M10. Further, the M10 also effects the operation of the polycrystalline silicon diode D1 of the constant-voltage circuit simultaneously with that of M5.

Figure 19:
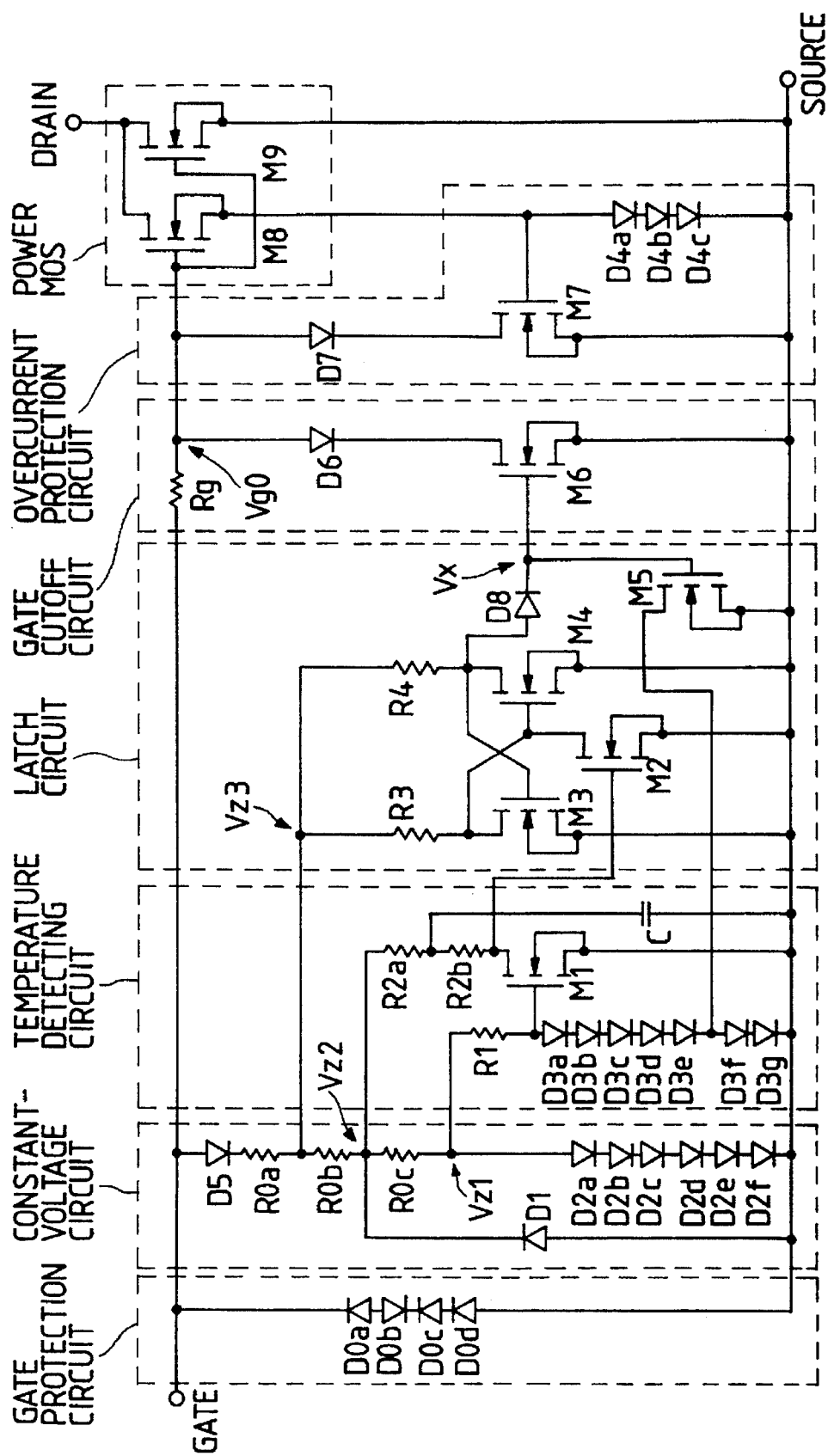
FIG. 19 is a circuit diagram depicting a semiconductor device according to a tenth embodiment of the present invention.

FIG. 19 is a circuit diagram illustrating a semiconductor device according to a tenth embodiment of the present invention. The present embodiment shows a case where even when the drain terminal of the power MOSFET is rendered negative and information stored in the latch circuit is erased, a polycrystalline silicon diode D8 facilitates holding the gate voltage of M6. It is necessary for the present embodiment to lower a voltage of Vx with a leakage current flowing in the diode D8 in order to completely reset a cutoff circuit.

Figure 20:
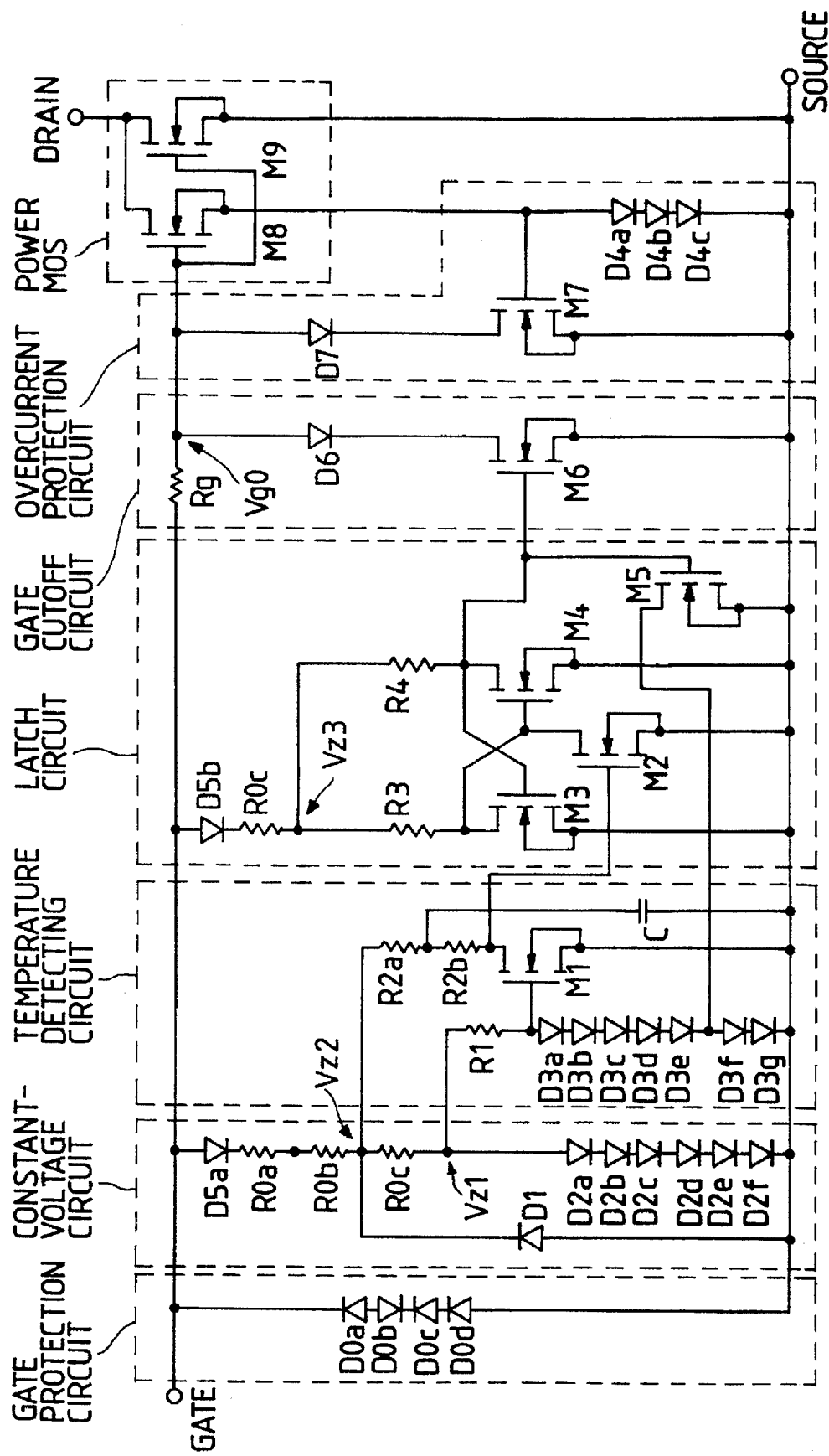
FIG. 20 is a circuit diagram showing a semiconductor device according to an eleventh embodiment of the present invention.

FIG. 20 is a circuit diagram showing a semiconductor device according to an eleventh embodiment of the present invention. The present embodiment shows a case where a current produced from a latch circuit is prevented from flowing in a resistance R0a. Thus, an advantageous effect can be brought about that when a cutoff circuit starts to operate, it is possible to avoid variation of Vz2 and Vz1 with an increase in current flowing in the resistance R0a so that cutoff conditions become unstable.

Figure 21:
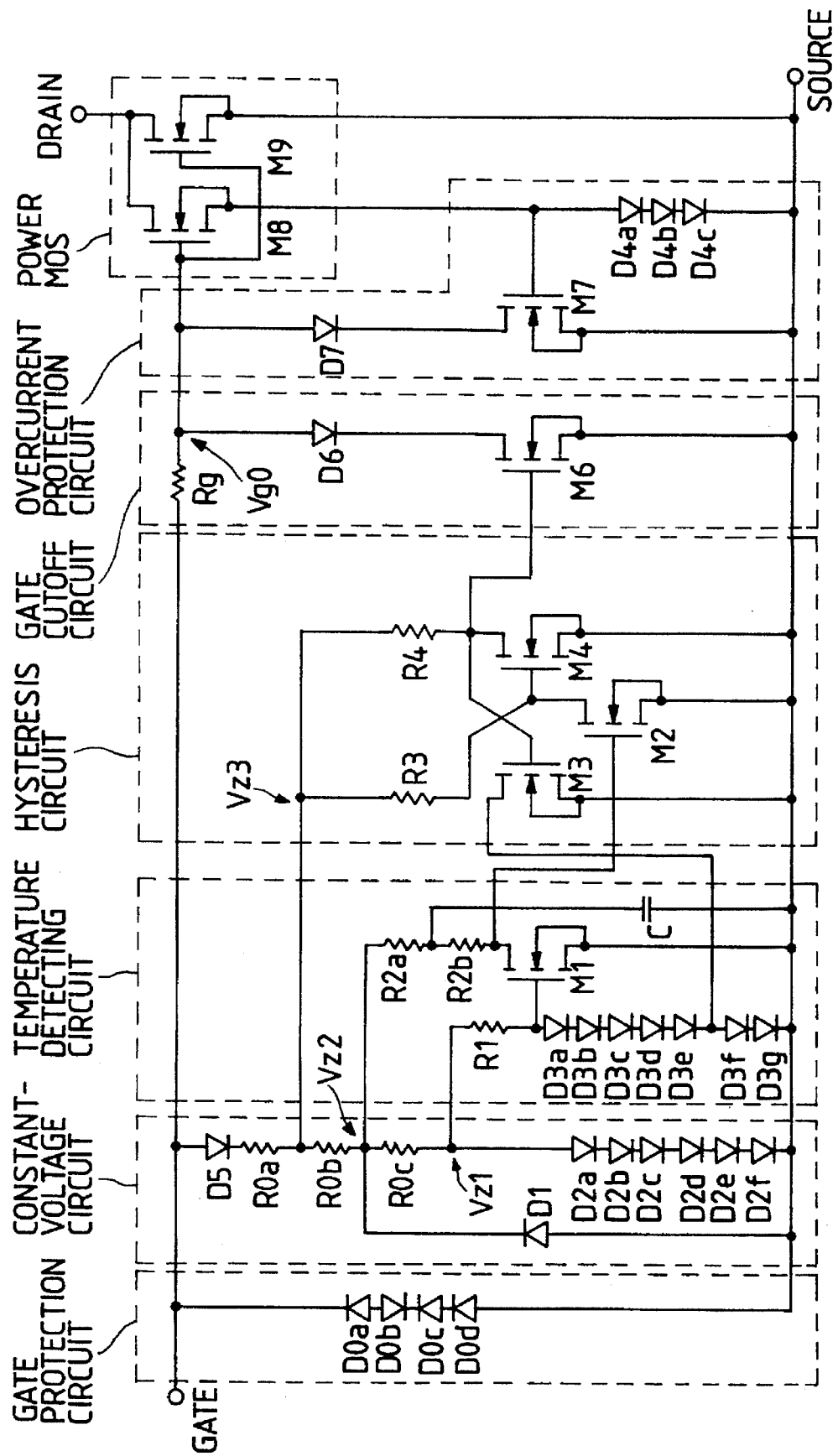
FIG. 21 is a circuit diagram illustrating a semiconductor device according to a twelfth embodiment of the present invention.

FIG. 21 is a circuit diagram showing a semiconductor device according to a twelfth embodiment of the present invention. The circuit diagrams, which have been explained in the above-described embodiments, were related to the power MOSFETs with the latch-type overheating protection circuits incorporated therein. On the contrary, the present embodiment shows the circuit diagram related to a power MOSFET with a hysteresis-type overheating protection circuit incorporated therein, of a type wherein even when a chip is brought to a high temperature so that a cutoff circuit is operated, a cutoff state is automatically released or reset when the temperature of the chip is reduced to about 100° C., for example. A feature of the present embodiment is that the M3 shown in FIG. 1 is different in connection from M3 shown in FIG. 21, and M5 is unnecessary (the present M3 serves in the same manner as M5). The circuit employed in the present embodiment is simply different in the action subsequent to the operation of the cutoff circuit from a latch-type circuit. A feature of the present circuit is that the same advantageous effect as that described in the first embodiment can be obtained.

Figure 22:
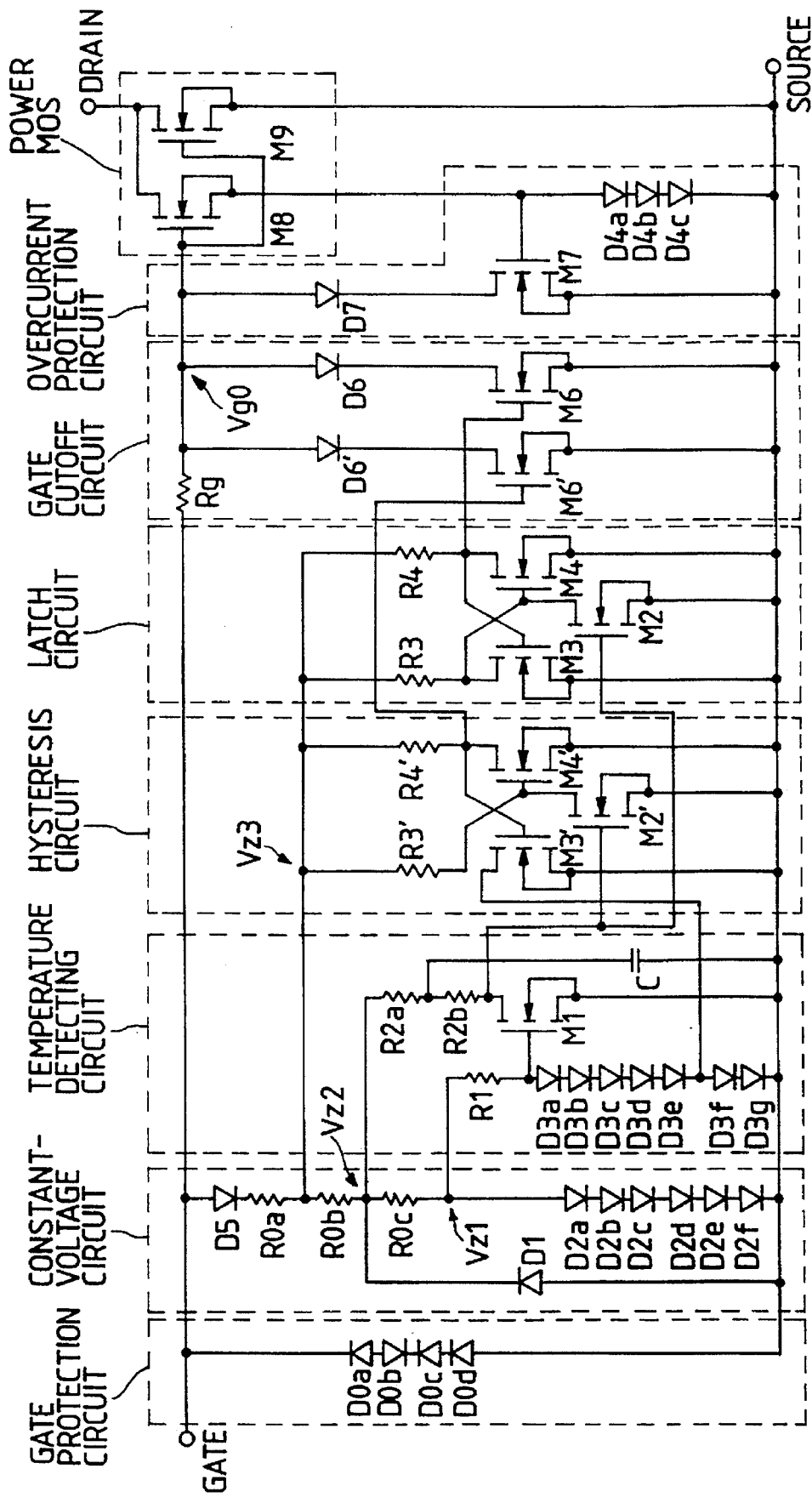
FIG. 22 is a circuit diagram depicting a semiconductor device according to a thirteenth embodiment of the present invention.

FIG. 22 is a circuit diagram illustrating a semiconductor device according to a thirteenth embodiment of the present invention. In the present embodiment, a hysteresis circuit and a latch circuit are both incorporated into the semiconductor device, and the hysteresis circuit is activated at a temperature lower than that at which the latch circuit is operated. Thus, the hysteresis circuit is operated according to a slow increase in temperature, and the cutoff circuit is automatically released or reset after the chip has been cooled. Since, however, the hysteresis circuit is operated according to an abrupt increase in chip temperature and the latch circuit is also activated before the feedback is exerted on a temperature detecting circuit, a cutoff state is held as it is even after the chip has been cooled. That is, different operations can be carried out according to conditions in such a way that, for example, the latch circuit is operated upon occurrence of a load trouble such as a short circuit in a load, and the hysteresis circuit is operated when the chip temperature is raised with a slow increase in ambient temperature.

Figure 23:
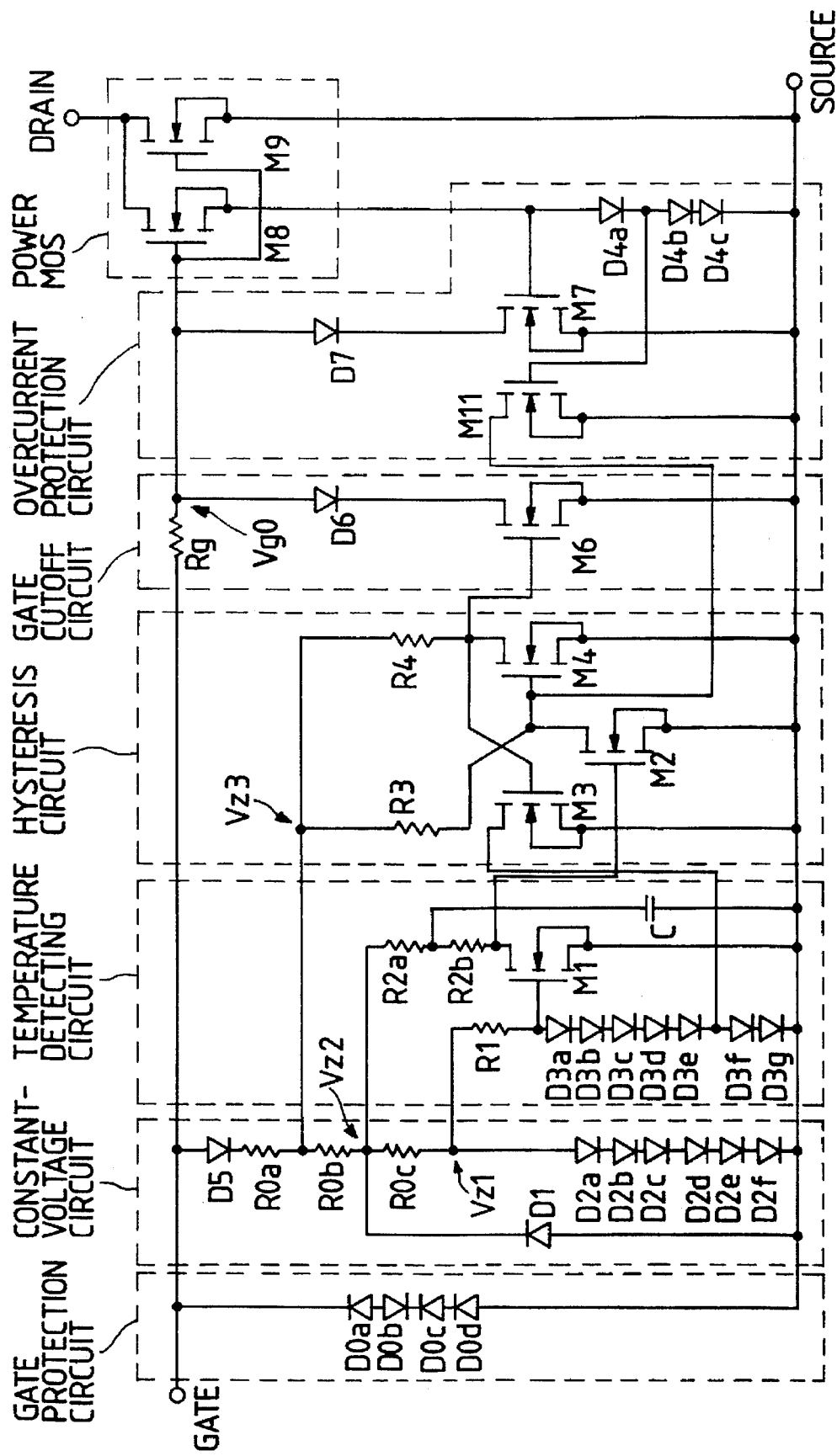
FIG. 23 is a circuit diagram showing a semiconductor device according to a fourteenth embodiment of the present invention.

FIG. 23 is a circuit diagram showing a semiconductor device according to a fourteenth embodiment of the present invention. A feature of the present embodiment is that MOSFET M11 is added to an overcurrent protective circuit and is electrically connected to a hysteresis circuit. When an overcurrent of a relatively low level flows, the above-described embodiments show the case where the gate voltage of the power MOSFET is reduced by M7 so as to restrict the overcurrent. In the present embodiment, however, when an overcurrent of a relatively high level flows upon occurrence of a short circuit in a load, the hysteresis circuit is operated by M11 to thereby completely cut off the flow of the overcurrent until the temperature of the chip is reduced. It is thus possible to protect the circuit shown in FIG. 23 against an abrupt increase in the chip temperature, which makes a delay in response of a temperature detecting circuit, for example. When M11 employed in the present embodiment is added to the circuit shown in FIG. 22 and the drain of M11 is electrically connected to the gate of a MOSFET M4', a latch-type overheating cutoff circuit and a hysteresis-type overcurrent cutoff circuit can also be incorporated in the present circuit.

When the overheating cutoff circuit is of a hysteresis type, a cutoff state is automatically released or reset when the overheating protective circuit is operated. Therefore, an advantageous effect can be obtained that a process for resetting the cutoff state when the cutoff circuit is misoperated can be saved. On the other hand, when the overheating cutoff circuit is of a latch type, the cutoff state is held when the cutoff circuit is operated due to an improper condition of a load or the like. Therefore, an advantageous effect can be brought about that the cause of the improper condition can be easily diagnosed.

Figure 25:
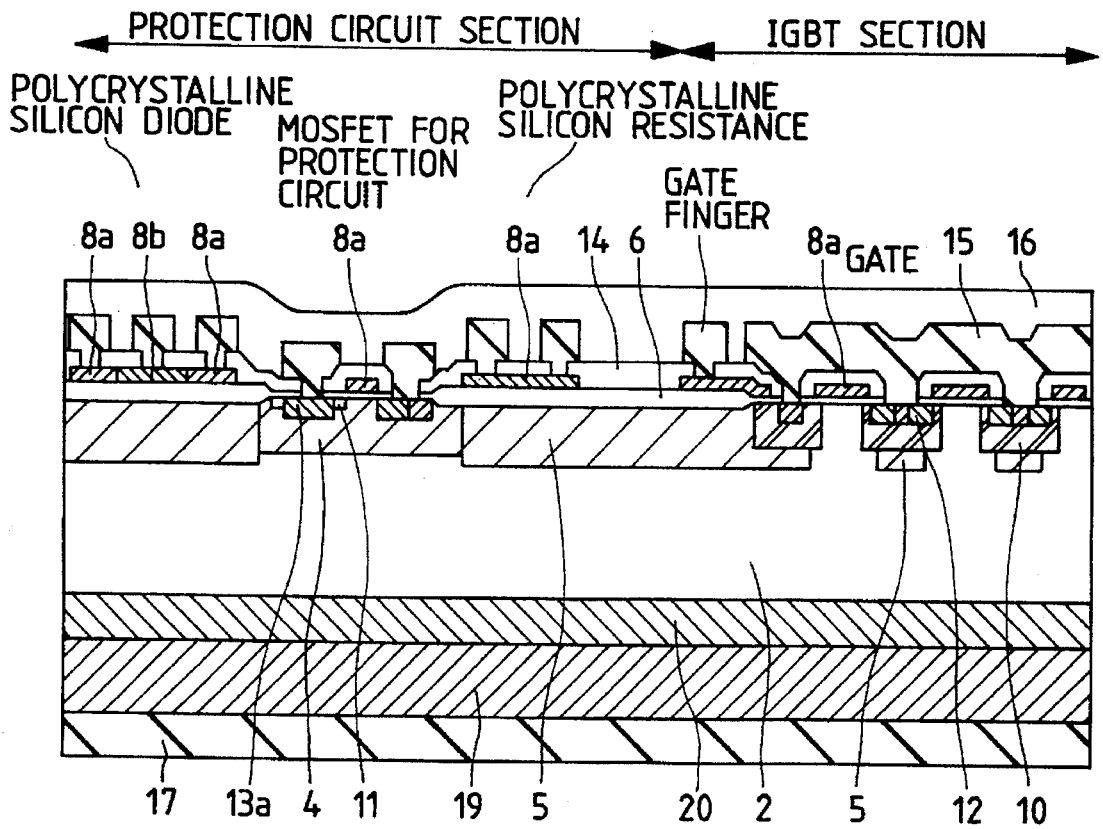
FIG. 25 is a view for describing a planar structure of a semiconductor device according to a sixteenth embodiment of the present invention.

FIG. 24 is a circuit diagram illustrating a semiconductor device according to a fifteenth embodiment of the present invention. FIG. 25 is a sectional structural view of the semiconductor device. A high-density p-type semiconductor substrate 19 serves as a collector. A high-density n-type region 20 serves as an n-type buffer layer for preventing minority carriers from entering out of the collector. An n-type epitaxial layer 2 serves as an n-type base and a p-type region 10 serves as a p-type base. A high-density n-type region 12 serves as an emitter.

In the present embodiment, a circuit diagram is shown in which an IGBT (Insulated Gate Bipolar Transistor) is used as an alternative to the power MOSFET, and an overcurrent protection circuit is internally provided. A transistor M9 serves as a main IGBT and a transistor M8 serves as a sensing IGBT. A feature of the present embodiment is that polycrystalline silicon diodes D7a through D7c and D0e through D0h are provided in a manner similar to the description of FIG. 1 to prevent a parasitic current from flowing from the collector to the gate when the gate is brought into a negative state. When the gate voltage becomes negative and a drain-to-body diode of a MOSFET M7 for a protection circuit is forward-biased in the case of the IGBT, a parasitic thyristor comprised of an n region 13a, a p region 4, the n-type regions 2 and 20 and the p region 19 is operated. Therefore, operational conditions become more serious as compared with the power MOSFET. In order to prevent the parasitic thyristor from operating, withstand voltages of the polycrystalline silicon diodes and forward voltages developed thereacross may be set so as to meet the following relationship in accordance with an idea similar to that described with reference to FIG. 1:

$$BV(D7a)+BV8(D7b)+BV(D7c)>Vf(D0e)+BV(D0f)+Vf(D0g)+BV(D0h)$$

where

BV(D7a)=BV8(D7b)=BV(D7c)=BV(D0f)=BV(D0h)=7, Vf(D0e)=BV(D0f)=Vf(D0g)=0.4 V.

When it is unnecessary to consider the withstand voltages at the time that the gate voltage has become negative, the polycrystalline silicon diodes may be only D7a and D0e. If the following inequality is established in this case, then the parasitic thyristor can be prevented from operating. BV(D7a)>Vf(D0e)

When the present device or IGBT is cut off and operated within an emitter follower circuit (corresponding to a circuit in which the collector is connected to a power supply and the emitter is connected to a load) at a high speed, the current flows from an emitter terminal to a gate terminal. However, when the current increases, the right term of the above inequality becomes large. Thus, when it is desired to increase a permissible current that flows from the emitter terminal to the gate terminal, it is necessary that a gate protection circuit comprised of D0e, D0f, D0g and D0h be constructed as externally-provided diodes to thereby meet the aforementioned inequality so as to prevent D7a, D7b and D7c from being subjected to breakdown. When it is unnecessary to consider a gate-to-source withstand voltage at the time that the gate has been rendered negative, the diode to be externally provided may be D0e alone in a manner similar to the above contents.

Figure 26:
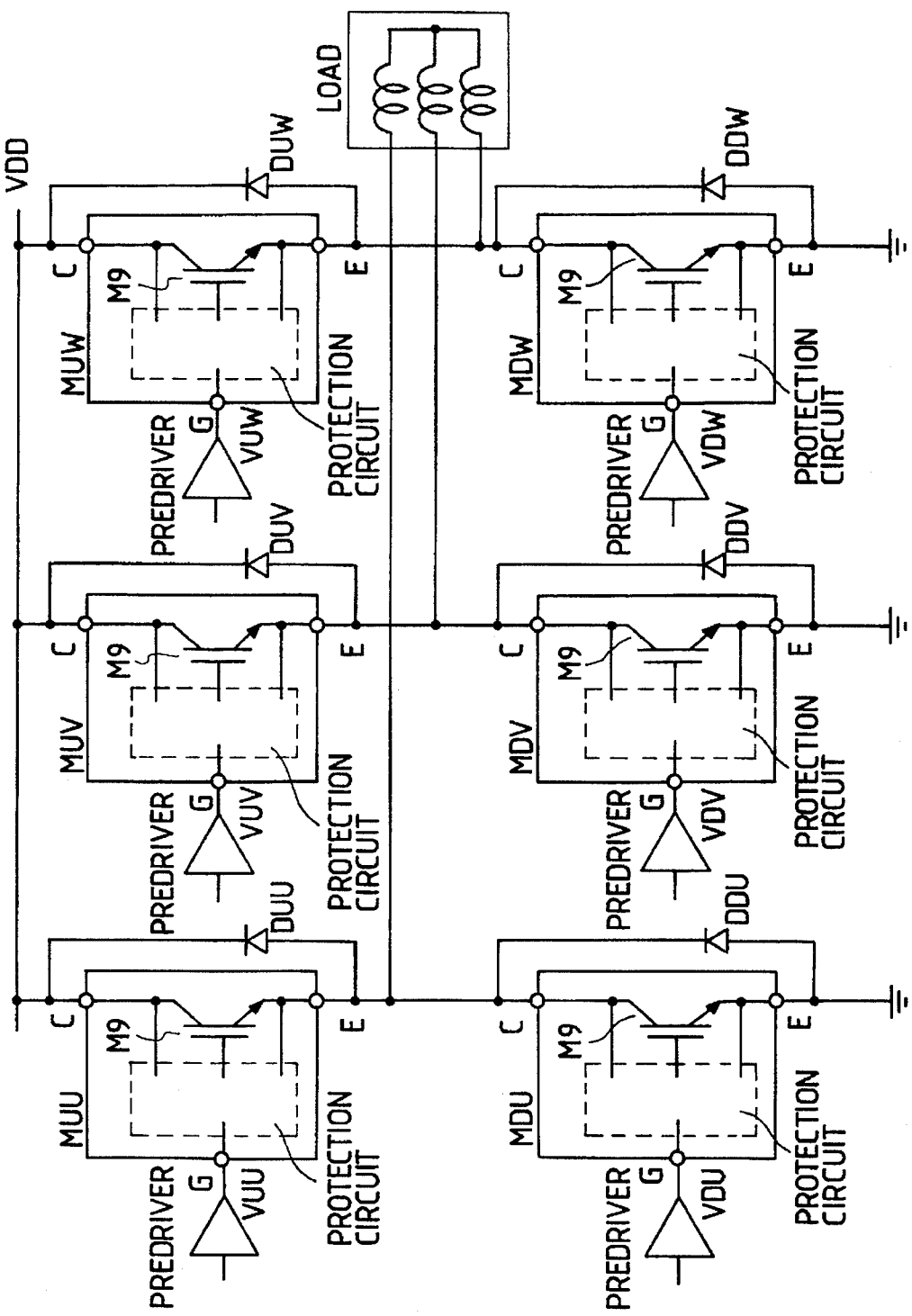
FIG. 26 is a circuit diagram showing a three-phase inverter using a semiconductor device according to the present invention.

FIG. 26 shows a three-phase inverter circuit using the IGBT shown in FIG. 24 with the overheating protective circuit incorporated therein. In the case of the circuit shown in FIG. 24, no leakage current flows from the collector of the IGBT to the gate thereof even when the negative voltage is applied to the gate as described above. It is therefore possible to use, as the emitter follower, the IGBT with the overcurrent protection circuit incorporated therein as in the present embodiment.

Figure 27:
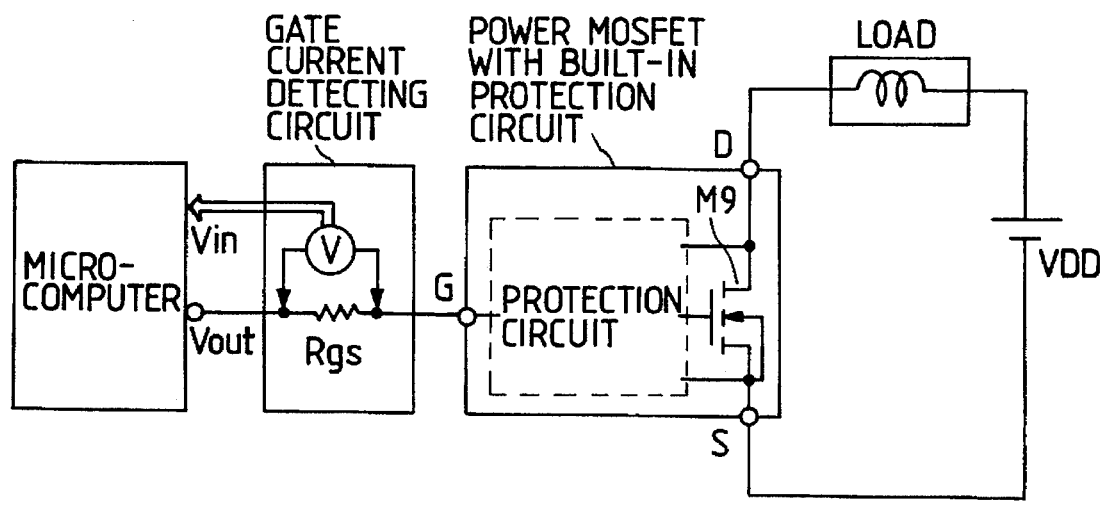
FIG. 27 is a view for describing a circuit used to drive a semiconductor device according to the present invention with a controller.

FIG. 27 is a view illustrating a circuit for driving a semiconductor device by means of a controller. When the circuit for cutting off the power MOSFET having the protection circuit incorporated therein, which has been described in the present invention, is operated, a gate current rapidly increases. Therefore, a highly reliable system can be constructed wherein the gate current is monitored by a gate current detecting circuit, an output Vout produced from a microcomputer which serves as the controller is set to a low potential when a cutoff operation is performed by the power MOSFET, and the Vout is set to a high potential again after a decision has been made as to whether or not the circuit is in an improper state.

Figure 28:
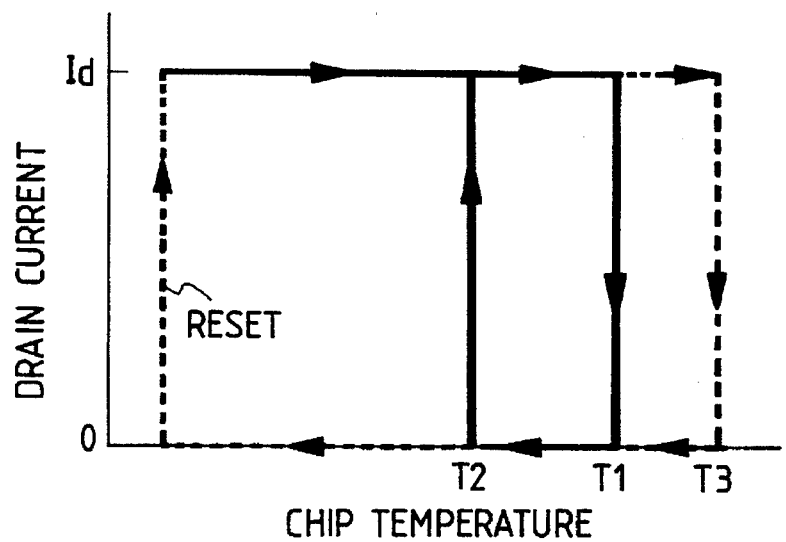
FIG. 28 is a characteristic view for describing the operation of the circuit shown in FIG. 22.

FIG. 28 is an explanatory view for effecting supplemental remarks on the operation of the circuit shown in FIG. 22. Symbol T1 indicates a chip temperature at which a hysteresis-type overheating cutoff circuit starts to operate. Symbol T2 indicates a temperature at which a cutoff operation of the hysteresis-type overheating cutoff circuit is released or reset. Symbol T3 indicates a chip temperature at which a latch-type overheating cutoff circuit is operated. When the chip temperature is less than or equal to T1, a drain current Id flows. Now consider that an increase in the chip temperature is slow. When the chip temperature reaches T1 in this condition, the cutoff circuit is operated so that the chip temperature is reduced. On the other hand, when the chip temperature reaches T2, the current automatically flows. However, when the rate of increase in the chip temperature is sharp, the chip temperature increases even after a hysteresis circuit has started operating, and reaches the temperature T3 for activating the latch circuit. In this case, the drain current is not automatically reset even after the power MOSFET has been cut off and the chip temperature has been reduced. It is thus necessary to temporarily reduce the voltage at an external gate terminal to zero volts so as to reset the external gate terminal.

In the various embodiments (planar structures of semiconductor devices: chip layout) of the present invention, the diodes D2a through D2f (see FIG. 1) for the constant-voltage circuit respectively have temperature characteristics similar to those of the temperature detecting diodes D3a through D3g. It is therefore possible to dispose the diodes D2a through D2f in the same positions (see FIG. 2) as those where the diodes D3a through D3f are disposed, inclusive of the resistance R1. Alternatively, the diodes D2a through D2f alone can be disposed in the same places (see FIG. 2) as those where the diodes D3a through D3g are disposed. The former is accompanied by a problem that since the rate of reduction in the gate voltage of M1 is lowered when a device or element having a negative temperature characteristic (in which a resistance value decreases with an increase in temperature) is used as the resistance R1, the cutoff circuit is hard to operate. However, the latter can bring about an advantageous effect that the above problem can be avoided.

According to the present invention, specific operations and effects have been described in the above embodiments. In summary, however, an advantageous effect can be obtained that the power MOSFET with the protection circuit incorporated therein and the IGBT, both of which are high in reliability and easy to use, can be provided.

It will be apparent to those skilled in the art that many changes and modifications can be made without departing from the spirit or scope of the invention as set forth herein.

What is claimed is:

1. A semiconductor device comprising:
 a first terminal;
 a second terminal;
 a third terminal;
 a first insulated gate transistor having a first current path coupled between said second terminal and said third terminal, and a gate coupled to said first terminal;
 a second insulated gate transistor having a second current path coupled between said second terminal and said third terminal and a gate coupled to said first terminal, for monitoring a drain current supplied to the first current path of the first insulated gate transistor;
 a first diode having an anode coupled to said first terminal, and a cathode, for preventing a current flowing from the second terminal to the first terminal when an overvoltage appears at the first terminal;
 a switch circuit having a third current path coupled between said cathode of said first diode and said third terminal, and a control terminal coupled to one end of said second current path of said second insulated gate transistor, wherein the switch circuit is turned on to limit the drain current of the first insulated gate transistor based on the monitored drain current of the first insulated gate transistor; and
 a protection circuit for preventing a breakdown of the first diode when the overvoltage appears at the first terminal, said protection circuit being coupled between said first terminal and said third terminal.

2. A semiconductor device according to claim 1, wherein the overvoltage is a negative voltage against a voltage value of the third terminal.

3. A semiconductor device according to claim 1, wherein said switch circuit comprises a first MOSFET having a drain-source path coupled between said cathode of said first diode and said third terminal, and having a gate coupled to said control terminal.

4. A semiconductor device according to claim 3, wherein said first MOSFET is of an n-channel type.

5. A semiconductor device according to claim 1, wherein said first insulated gate transistor includes a second MOSFET, and wherein said second insulated gate transistor includes a third MOSFET.

6. A semiconductor device according to claim 5, wherein the semiconductor device is fabricated on a single semiconductor substrate.

7. A semiconductor device according to claim 1, wherein said first insulated gate transistor includes a first insulated gate bipolar transistor; and wherein said second insulated gate transistor includes a second insulated gate bipolar transistor.

8. A semiconductor device according to claim 7, wherein the semiconductor device is fabricated on a single semiconductor substrate.

9. A semiconductor device according to claim 1, wherein said protection circuit comprises a second diode having an anode coupled to said third terminal, and a cathode coupled to said first terminal.

10. A semiconductor device according to claim 9, wherein said protection circuit further comprises a third diode having an anode coupled to said third terminal and a cathode coupled to said anode of said second diode.

11. A semiconductor device according to claim 9, wherein said protection circuit further comprises a third diode having an anode coupled to the anode of the second diode, and a cathode coupled to said third terminal.

12. A semiconductor device according to claim 9, wherein a with stand voltage of the first diode is larger than a forward voltage of the second diode.

13. A semiconductor device according to claim 9, wherein the first and second diodes are polycrystalline silicon diodes.

14. A semiconductor device according to claim 9, wherein the overvoltage is a negative voltage against a voltage value of the third terminal.

15. A semiconductor device comprising:

a first terminal;

a second terminal;

a third terminal;

an insulated gate transistor having a current path coupled between said second terminal and said third terminal, and a gate coupled to said first terminal;

a temperature detecting circuit including a temperature detecting element for detecting a temperature of said semiconductor device, wherein said temperature detecting circuit outputs a temperature detecting signal when the temperature of said semiconductor device is greater than or equal to a predetermined value, and wherein said temperature detecting element is coupled between said first terminal and said third terminal;

a first switch circuit having a first current path coupled between said first terminal and said third terminal, and a first control terminal coupled to receive said temperature detecting signal, the first switch circuit being turned on so as to cutoff the insulated gate transistor in response to said temperature detecting signal; and a constant-voltage circuit for generating an operating voltage of the temperature detecting circuit, and which is coupled between said first terminal and said third terminal;

wherein the constant-voltage circuit includes a first diode having a first anode coupled to the first terminal and a first cathode coupled to the third terminal;

wherein the temperature detecting element includes a second diode having a second anode coupled to a second control terminal and a second cathode coupled to the third terminal;

wherein the temperature detecting circuit further includes:

a second switch circuit having a second current path coupled between the first terminal, the third terminal, and the first control terminal, and having the second control terminal, the second switch circuit generating the temperature detecting signal: and a first resistor coupled between the second control terminal and the first terminal; and wherein the temperature detecting element is coupled between the second control terminal and the third terminal.

16. A semiconductor device according to claim 15, further comprising:

a third diode having a third anode coupled to the third terminal and a third cathode coupled to the first terminal, for limiting an overvoltage value of the first terminal.

17. A semiconductor device according to claim 15, wherein the first switch circuit comprises a first MOSFET having a first gate terminal coupled to the first control terminal, and having a first drain terminal and a first source terminal coupled to the first current path;

wherein the second switch circuit comprises a second MOSFET having a second gate terminal coupled to the second control terminal, and having a second drain terminal and a second source terminal coupled to the second current path; and wherein the temperature detecting signal is output from the second drain terminal of the second MOSFET to the first gate terminal of the first MOSFET.

18. A semiconductor device according to claim 17, further comprising:

a latch circuit coupled between the second drain terminal and the first gate terminal, for holding the temperature detecting signal.

19. A semiconductor device according to claim 18, wherein the semiconductor device is fabricated on a single semiconductor substrate.

20. A semiconductor device comprising:

a first terminal;

a second terminal;

a third terminal;

an insulated gate transistor having a current path coupled between said second terminal and said third terminal and a gate coupled to said first terminal;

a temperature detecting device adapted to output a temperature detecting signal when the temperature of said device is greater than or equal to a predetermined value;

a switch circuit having a current path coupled between said first terminal and said third terminal, and a control terminal coupled to receive said temperature detecting signal; and a pad formed over a semiconductor substrate in which said insulated gate transistor, said temperature detecting device, and said switch circuit are formed, said pad being coupled to said third terminal;

wherein said pad is arranged substantially at a center of said semiconductor substrate; and wherein said temperature detecting device is arranged adjacent to said pad.

21. A semiconductor device comprising:

an insulated gate transistor;

a hysteresis-type cutoff circuit adapted to cut off said insulated gate transistor when a temperature of said semiconductor device is higher than or equal to a first temperature, and adapted to bring said insulated gate transistor into a conductive state when a temperature of said semiconductor device is lower than or equal to a second temperature; and a latch circuit adapted to continuously hold said insulated gate transistor at a cutoff state when a temperature of said device is changed to a temperature greater than or equal to a third temperature higher than said first temperature.

22. A semiconductor device comprising, an insulated gate transistor;

a hysteresis-type cutoff circuit adapted to cut off said insulated gate transistor when a temperature of said device is higher than or equal to a first temperature, and adapted to bring said insulated gate transistor into a conductive state when a temperature of said device is lower than or equal to a second temperature;

a current detecting circuit adapted to detect a current of said insulated gate transistor; and an overcurrent protection circuit adapted to render said insulated gate transistor non-conductive when said current of said insulated gate transistor is larger than or equal to a predetermined value.

23. A semiconductor device comprising:

an insulated gate transistor;

a hysteresis-type cutoff circuit adapted to cut off said insulated gate transistor when a current of said insulated gate transistor is higher than or equal to a first value, and adapted to bring said insulated gate transistor into a conductive state when a current of said insulated gate transistor is lower than or equal to a second value which is smaller than said first value; and a latch circuit adapted to continuously hold said insulated gate transistor at a cutoff state when a temperature of said device is changed to a predetermined temperature.

* * * * *